United States Patent
Xie et al.

(10) Patent No.: US 11,450,613 B2
(45) Date of Patent: Sep. 20, 2022

(54) INTEGRATED CIRCUIT PACKAGE WITH TEST CIRCUITRY FOR TESTING A CHANNEL BETWEEN DIES

(71) Applicant: Intel Corporation, Santa Clara, CA (US)

(72) Inventors: Mayue Xie, Phoenix, AZ (US);
Jong-Ru Guo, Portland, OR (US);
Zhiguo Qian, Chandler, AZ (US);
Zuoguo Wu, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 1033 days.

(21) Appl. No.: 15/933,934

(22) Filed: Mar. 23, 2018

(65) Prior Publication Data

US 2019/0295953 A1 Sep. 26, 2019

(51) Int. Cl.
*H01L 23/538* (2006.01)
*H01L 25/065* (2006.01)
*H01L 23/58* (2006.01)
*G01R 31/28* (2006.01)

(52) U.S. Cl.
CPC ...... *H01L 23/5384* (2013.01); *G01R 31/2896* (2013.01); *H01L 23/58* (2013.01); *H01L 25/0657* (2013.01)

(58) Field of Classification Search
CPC ............... G01R 31/2896; G01R 31/30; G01R 31/3004; H01L 25/115; H01L 25/0753; H01L 25/072; H01L 25/0655
USPC ....................................... 324/76.11, 713, 754
See application file for complete search history.

(56) References Cited

U.S. PATENT DOCUMENTS

| | | | | |
|---|---|---|---|---|
| 6,812,691 | B2* | 11/2004 | Miller ............... | G01R 31/31723 324/762.03 |
| 7,075,175 | B2* | 7/2006 | Kazi ............... | G01R 31/318505 327/518 |
| 7,365,554 | B2* | 4/2008 | Vollrath ........... | G01R 19/16552 324/762.02 |
| 7,772,831 | B2* | 8/2010 | Kazi .................. | G01R 31/3008 324/762.03 |

(Continued)

FOREIGN PATENT DOCUMENTS

| | | | | |
|---|---|---|---|---|
| CN | 101569108 B | * | 8/2013 | ....... H04L 25/03885 |
| CN | 111261535 A | * | 6/2020 | ......... G01R 31/2853 |

(Continued)

*Primary Examiner* — Jermele M Hollington
*Assistant Examiner* — Sean Curtis
(74) *Attorney, Agent, or Firm* — Schwabe, Williamson & Wyatt, P.C.

(57) ABSTRACT

Apparatuses, systems and methods associated with integrated circuit packages with integrated test circuitry for testing of a channel between dies are disclosed herein. In embodiments, an integrated circuit (IC) package may include a first die, a second die, and a channel that couples the first die to the second die. The first die may include a transmitter, test circuitry coupled between the transmitter and the channel, wherein the test circuitry is to control charge and discharge of the channel, and a receiver coupled to the channel. The receiver may determine a voltage of the channel during charge and discharge of the channel, and output an indication of the voltage. Other embodiments may be described and/or claimed.

15 Claims, 12 Drawing Sheets

(56) References Cited

U.S. PATENT DOCUMENTS

| | | | |
|---|---|---|---|
| 7,821,281 B2* | 10/2010 | Chen | G01R 31/31716 324/762.03 |
| 8,253,442 B2* | 8/2012 | Hollis | H04L 25/0282 326/82 |
| 8,829,934 B2* | 9/2014 | Sellathamby | G01R 31/3025 324/754.03 |
| 8,922,230 B2* | 12/2014 | Wang | H01L 22/14 324/754.03 |
| 9,252,593 B2* | 2/2016 | Wang | G01R 1/36 |
| 9,513,330 B2* | 12/2016 | Vukic | G01R 31/2853 |
| 9,551,741 B2* | 1/2017 | Thiruvengadam | G01R 31/3008 |
| 9,646,947 B2* | 5/2017 | Bandholz | H01L 25/0657 |
| 9,900,970 B2* | 2/2018 | Wang | G01R 1/36 |
| 10,338,133 B2* | 7/2019 | Chakrabarty | G01R 31/44 |
| 10,439,065 B2* | 10/2019 | Tellkamp | H01L 23/49575 |
| 10,634,713 B2* | 4/2020 | Yuan | G01R 31/3008 |
| 10,652,987 B2* | 5/2020 | Wang | H05F 3/02 |
| 10,692,841 B2* | 6/2020 | Mohr | H01L 22/14 |
| 10,784,204 B2* | 9/2020 | Aygun | H01L 23/5286 |
| 10,805,123 B2* | 10/2020 | Singh | H04L 25/0268 |
| 10,838,003 B2* | 11/2020 | Chakrabarty | G01R 31/2884 |
| 10,862,714 B1* | 12/2020 | Narang | H04L 43/50 |
| 10,971,499 B2* | 4/2021 | Lu | H01L 27/10826 |
| 11,049,584 B2* | 6/2021 | Kim | G11C 29/025 |
| 11,094,785 B2* | 8/2021 | Majhi | H01L 29/775 |
| 11,256,012 B2* | 2/2022 | Meng | G01J 3/1895 |
| 2004/0008024 A1* | 1/2004 | Miller | G01R 31/31924 324/762.03 |
| 2004/0242171 A1* | 12/2004 | Hosokawa | H03K 5/1534 455/127.1 |
| 2005/0236703 A1* | 10/2005 | Kazi | G01R 31/3008 257/678 |
| 2006/0214276 A1* | 9/2006 | Kazi | G01R 31/3008 257/678 |
| 2007/0139071 A1* | 6/2007 | Nguyen | H04L 25/0278 326/30 |
| 2010/0213965 A1* | 8/2010 | Chen | G01R 31/2853 324/762.03 |
| 2011/0006794 A1* | 1/2011 | Sellathamby | G01R 31/3025 324/754.03 |
| 2011/0148543 A1* | 6/2011 | Bandholz | H01L 25/50 257/E21.531 |
| 2012/0286814 A1* | 11/2012 | Wang | G01R 1/07378 257/E21.531 |
| 2013/0271167 A1* | 10/2013 | Thiruvengadam | G01R 31/3008 324/750.02 |
| 2014/0070838 A1* | 3/2014 | Vukic | G01R 31/2853 324/762.03 |
| 2014/0167799 A1* | 6/2014 | Wang | G01R 1/07378 361/220 |
| 2016/0113099 A1* | 4/2016 | Wang | H05K 1/181 361/220 |
| 2017/0343603 A1* | 11/2017 | Chakrabarty | H01L 25/0657 |
| 2018/0153026 A1* | 5/2018 | Wang | H05K 1/11 |
| 2019/0109233 A1* | 4/2019 | Tellkamp | H01L 23/49575 |
| 2019/0278245 A1* | 9/2019 | Singh | G01R 31/317 |
| 2019/0279963 A1* | 9/2019 | Woo | H01L 23/481 |
| 2019/0295953 A1* | 9/2019 | Xie | H01L 23/5384 |
| 2019/0302179 A1* | 10/2019 | Chakrabarty | H01L 29/0642 |
| 2019/0305549 A1* | 10/2019 | Muljono | H02H 9/041 |
| 2020/0006291 A1* | 1/2020 | Mohr | H01L 22/14 |
| 2020/0006562 A1* | 1/2020 | Tellkamp | H01L 23/495 |
| 2020/0066641 A1* | 2/2020 | Aygun | H01L 23/50 |
| 2020/0158776 A1* | 5/2020 | Jeong | G01R 31/2853 |
| 2020/0185388 A1* | 6/2020 | Lu | G11C 5/04 |
| 2020/0227130 A1* | 7/2020 | Kim | G11C 7/222 |
| 2020/0303349 A1* | 9/2020 | Mohr | G01R 31/2853 |
| 2021/0202266 A1* | 7/2021 | Chen | H01L 21/6835 |
| 2021/0210495 A1* | 7/2021 | Lu | H01L 25/18 |
| 2021/0257338 A1* | 8/2021 | Keeth | H01L 25/0657 |
| 2021/0260795 A1* | 8/2021 | Plummer | B29C 33/301 |
| 2021/0263660 A1* | 8/2021 | Pilolli | G11C 16/32 |

FOREIGN PATENT DOCUMENTS

| | | | | |
|---|---|---|---|---|
| KR | 101742281 B1 | * | 8/2013 | H03K 17/6872 |
| KR | 101742281 B1 | * | 6/2017 | |
| KR | 20210014705 A | * | 2/2021 | |
| KR | 101930980 B1 | * | 8/2021 | H01L 27/0214 |
| WO | WO-2005052612 A2 | * | 6/2005 | G01R 31/318566 |
| WO | WO-2005109021 A | * | 11/2005 | G01R 31/318505 |
| WO | WO-2005109021 A | * | 11/2005 | G01R 31/3008 |
| WO | WO-2005109021 A1 | * | 11/2005 | G01R 31/3008 |
| WO | WO-2009105885 A1 | * | 9/2009 | G01R 31/3025 |
| WO | WO-2010062618 A1 | * | 6/2010 | H01L 27/0248 |
| WO | WO-2013077882 A1 | * | 5/2013 | G01R 31/2607 |
| WO | WO-2014003793 A1 | * | 1/2014 | G01R 31/2853 |
| WO | WO-2018004599 A1 | * | 1/2018 | G01R 31/31717 |
| WO | WO-2018009171 A1 | * | 1/2018 | H01L 23/498 |
| WO | WO-2018125173 A1 | * | 7/2018 | |

* cited by examiner

INTEGRATED CIRCUIT PACKAGE WITH TEST CIRCUITRY FOR TESTING A CHANNEL BETWEEN DIES

TECHNICAL FIELD

The present disclosure relates to the field of electronic circuits. More particularly, the present disclosure relates to integrated circuit packages with integrated test circuitry for testing of a channel between dies.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

In order to achieve higher density within integrated circuit (IC) packages, more than one die has been implemented in IC packages. Die-to-die connection channels through the IC packages (such as through the IC package, the interposer, wire-bonds, or through silicon vias (TSVs)) have provided shorter channel lengths than legacy through printed circuit board (PCB) connections. These die-to-die connection channels through the IC packages (which may be referred to as internal input/outputs or internal input/output (I/O) channels) may provide less signal loss, consume lower power, and enable smaller package form factors than the through PCB connections.

However, due to the internal I/O channels being inaccessible externally from the package, testing of the I/O channels presents a challenge. Legacy testing approaches includes physically removing a portion of material from the IC package and/or the die to access the channel, thereby destroying the IC package. Further, only a portion of the IC packages produced are tested due to the destructive nature of the IC package testing, which could result in undetected failures of the untested IC packages. These legacy approaches often result in waste of functional dies through the destructive testing and undesirable yield losses due to the inability to identify defective I/O channels during production.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Figure 1:
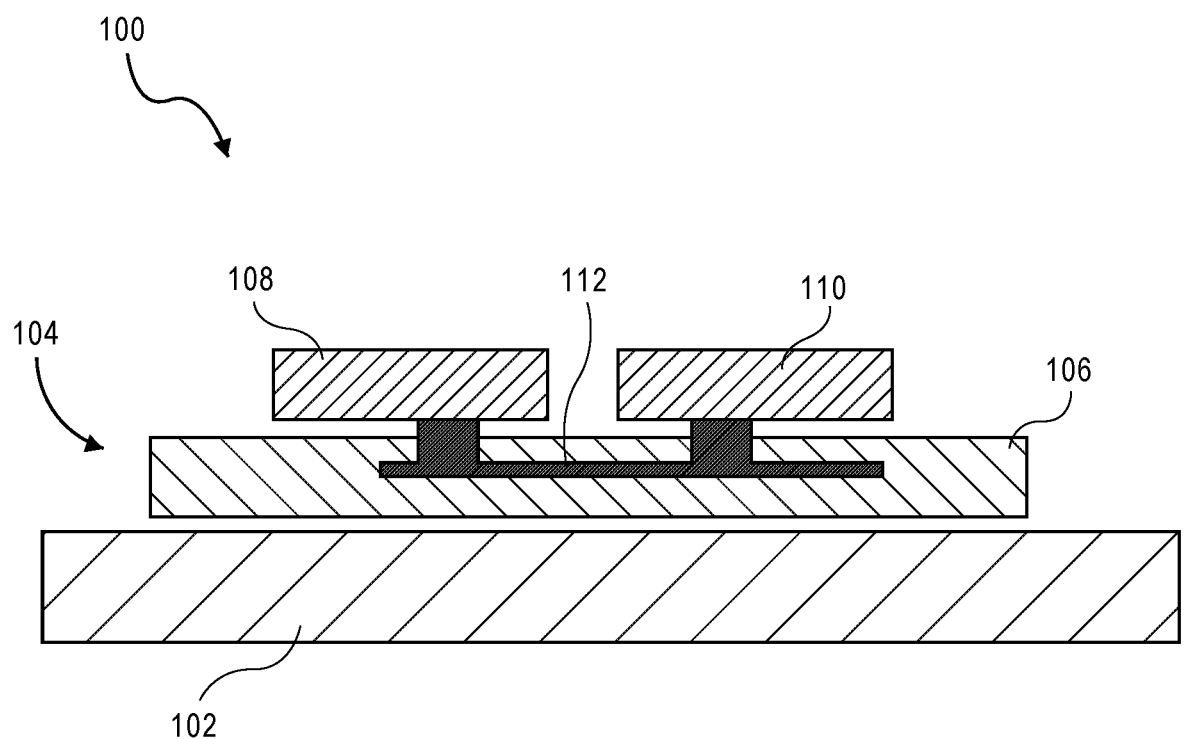
FIG. 1 illustrates an example integrated circuit (IC) package arrangement representation, according to various embodiments.

Apparatuses, systems and methods associated with integrated circuit packages with integrated test circuitry for testing of a channel between dies are disclosed herein. In embodiments, an integrated circuit (IC) package may include a first die, a second die, and a channel that couples the first die to the second die. The first die may include a transmitter, test circuitry coupled between the transmitter and the channel, wherein the test circuitry is to control charge and discharge of the channel, and a receiver coupled to the channel. The receiver may determine a voltage of the channel during charge and discharge of the channel, and output an indication of the voltage.

In the following detailed description, reference is made to the accompanying drawings which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Aspects of the disclosure are disclosed in the accompanying description. Alternate embodiments of the present disclosure and their equivalents may be devised without parting from the spirit or scope of the present disclosure. It should be noted that like elements disclosed below are indicated by like reference numbers in the drawings.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The disclosure may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "circuitry" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

Throughout this disclosure, transistors are described as coupling and decoupling elements. It is to be understood that coupling by a transistor may refer to the transistor operating in an "on" state (i.e., within a saturation region). In some embodiments, coupling by the transistor may further refer to the transistor operating within an active region. Further, it is to be understood that decoupling by a transistor may refer to the transistor operating in an "off" state (i.e., within a cutoff region). In some embodiments, the transistors may be replaced by switches that couple and decouple elements in accordance with the provided description. Further, in some embodiments, switches may be replaced by transistors operating in accordance with the above description.

FIG. 1 illustrates an example integrated circuit (IC) package arrangement 100 representation, according to various embodiments. The IC package arrangement 100 may include a printed circuit board (PCB) 102.

The IC package arrangement 100 may further include an IC package 104 mounted to the PCB 102. The IC package 104 may include a substrate 106, a first die 108, and a second die 110. The substrate 106 may be coupled to the PCB 102, the first die 108, and the second die 110. The substrate 106 may include one or more channels that direct signals among the PCB 102, the first die 108, and or the second die 110.

In the illustrated embodiment, a first channel 112 is shown. The first channel 112 may be extend through the substrate 106 and may electrically couple the first die 108 and the second die 110. The first channel 112 may be utilized for transmission of signals between the first die 108 and the second die 110 without the signals being transmitted through the PCB 102. The first channel 112 may be referred to as an internal input/output (IO) channel based on the first channel 112 providing transmission of signals internally within the IC package 104, without the signals being transmitted through the PCB 102.

Figure 2:
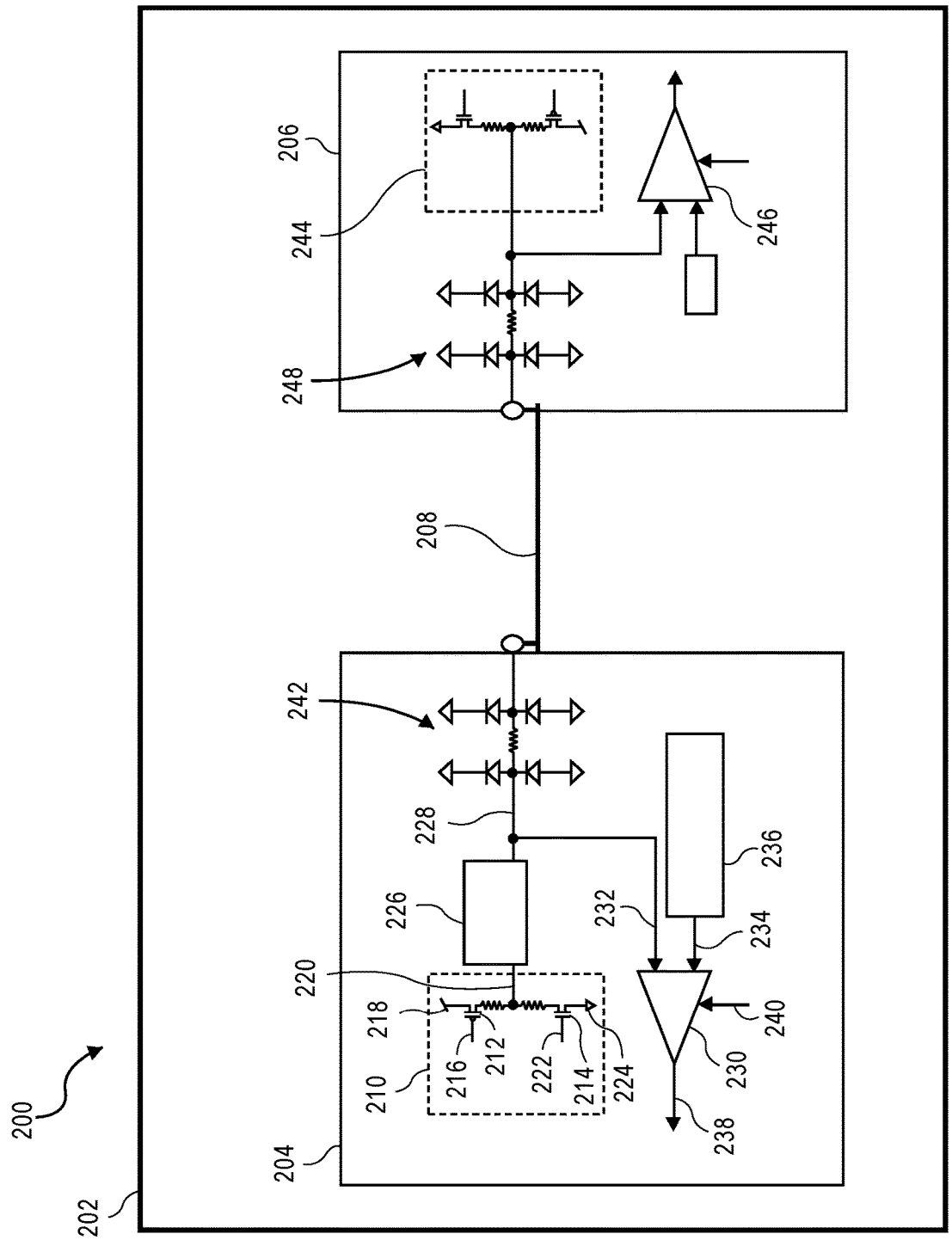
FIG. 2 illustrates an example circuit diagram for an IC package, according to various embodiments.

FIG. 2 illustrates an example circuit diagram 200 for an IC package, according to various embodiments. For example, the circuit diagram 200 may comprise a circuit diagram for the IC package 104 (FIG. 1), or some portion thereof.

The circuit diagram 200 may include an IC package 202. The IC package 202 may include one or more of the features of the IC package 104. In particular, the IC package 202 may include a first die 204 and a second die 206. The IC package 202 may further include a channel 208 that electrically couples the first die 204 and the second die 206, and provides for transmission of signals between the first die 204 and the second die 206. The channel 208 may comprise one or more wires, traces, vias, or other conductive features located within the IC package 202 that provide for electrical conduction between the first die 204 and the second die 206.

The first die 204 may include a transmitter 210. The transmitter 210 may include a first transistor 212 and a second transistor 214. The first transistor 212 may be coupled to a first control line 216. The first transistor 212 may receive a first control signal on the first control line 216. Based on the first control signal, the first transistor 212 may transition between coupling and decoupling a voltage rail 218 of the IC package 202 and a transmitter output line 220.

The second transistor 214 may be coupled to a second control line 222. The second transistor 214 may receive a second control signal on the second control line 222. Based on the second control signal, the second transistor 214 may transition between coupling and decoupling ground 224 of the IC package 202 and the transmitter output line 220.

In some embodiments, the first control line 216 and the second control line 222 may be coupled together, or may comprise a single control line coupled to both the first transistor 212 and the second transistor 214. In these embodiments, the first transistor 212 and the second transistor 214 may have opposite doping. For example, if the first transistor 212 is a P-channel field-effect transistor, the second transistor 214 may be an N-channel field-effect transistor. Based on the first transistor 212 and the second transistor 214 having opposite doping, only one of the first transistor 212 and the second transistor 214 may be in an "on" state at a time, while the other of the first transistor 212 and the second transistor 214 is in an "off" state.

The first die 204 may further include test circuitry 226. The test circuitry 226 may be coupled to the transmitter 210 via the transmitter output line 220. The test circuitry 226 may be coupled to a test circuitry output line 228. Based on a signal received from the transmitter 210 on the transmitter output line 220, the test circuitry 226 may output a signal on the test circuitry output line 228. The features of the test circuitry 226 are further described in relation to FIG. 3.

The first die 204 may further include a receiver 230. A first input 232 of the receiver 230 may be coupled to the test circuitry output line 228. A second input 234 of the receiver 230 may be coupled to a reference voltage 236. The receiver 230 may operate as a comparator for a signal on the test circuitry output line 228 and the reference voltage 236. The receiver 230 may output a signal on the receiver output line 238 based on the comparison of the signal on the test circuitry output line 228 and the reference voltage 236, wherein the signal may indicate a voltage of the signal on the receiver output line 238. The receiver 230 may update the outputted signal based on a clock received by the receiver 230 on a clock line 240. The features of the receiver 230 are described further in relation to FIG. 3.

The first die 204 may further include electrostatic discharge (ESD) circuitry 242. The ESD circuitry 242 may couple the test circuitry output line 228 and the channel 208. The ESD circuitry 242 may maintain a voltage of signals on the test circuitry output line 228 and the channel 208 between the voltage rail 218 of the IC package 202 and the ground 224 of the IC package 202, or at least limit an amount of time that the voltage of the signals on the test circuitry output line 228 and the channel 208 is outside of the voltage range between the voltage rail 218 and the ground 224. In some embodiments, the ESD circuitry 242 may be omitted and the test circuitry output line 228 is coupled to the channel 208.

The second die 206 may include one or more of the features of the first die 204. In particular, the second die 206 may include a transmitter 244, a receiver 246, and/or ESD circuitry 248. The transmitter 244 may include one or more of the features of the transmitter 210. Further, the receiver 246 may include one or more of the features of the receiver 230. Still further, the ESD circuitry 248 may include one or more of the features of the ESD circuitry 242.

As may be noticed from the illustrated embodiment of the IC package 202, the second die 206 may omit test circuitry, such as the test circuitry 226. For each channel coupled between two dies, one of the two dies may include test circuitry and the other die may omit the test circuitry. For example, the channel 208 is coupled between the first die 204 and the second die 206 in the illustrated embodiment, wherein the first die 204 includes test circuitry 226 and the second die 206 omits test circuitry. In other embodiments, both of the dies coupled by a channel may include test circuitry.

Figure 3:
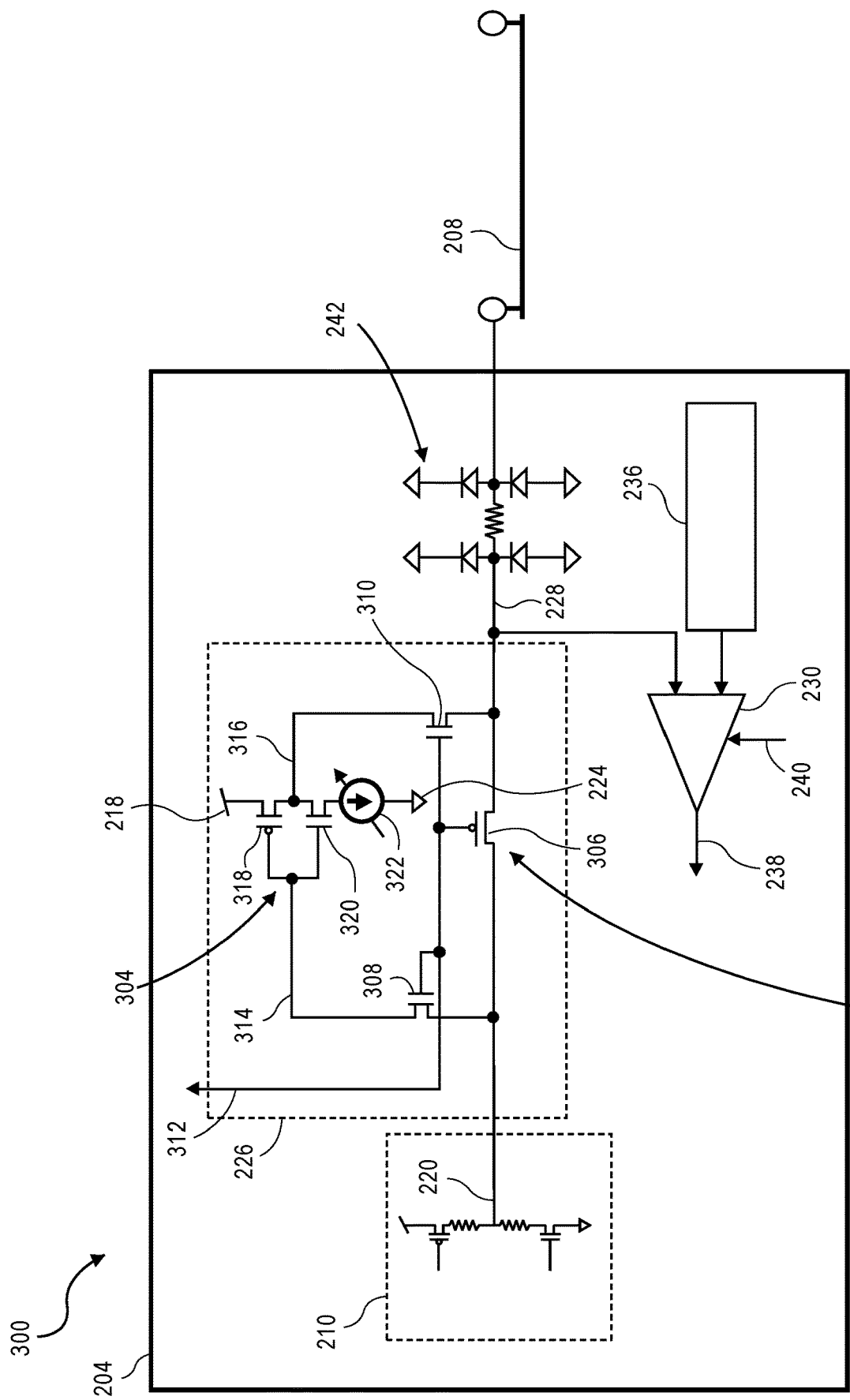
FIG. 3 illustrates an example circuit diagram of a portion of the IC package of FIG. 2, according to various embodiments.

FIG. 3 illustrates an example circuit diagram 300 of a portion of the IC package 202 of FIG. 2, according to various embodiments. In particular, the portion of the IC package 202 may include the first die 204 and the channel 208.

The first die 204 may include test circuitry 226. The test circuitry 226 may include bypass circuitry 302 and switching circuitry 304. The bypass circuitry 302 may couple the switching circuitry 304 in between the transmitter 210 and the channel 208 when the bypass circuitry 302 is in a first state, and may couple the transmitter 210 to the channel 208 when the bypass circuitry 302 is in a second state. The bypass circuitry 302 may further decouple the switching circuitry 304 from the transmitter 210 and/or the channel 208 when the bypass circuitry 302 is in the second state.

The bypass circuitry 302 may include a first transistor 306, a second transistor 308, and a third transistor 310. The first transistor 306, the second transistor 308, and the third transistor 310 may be coupled to a bypass control line 312. A signal may be applied to the bypass control line 312 to control states of the first transistor 306, the second transistor 308, and the third transistor 310. In particular, the first transistor 306, the second transistor 308, and the third transistor 310 may be changed between "on" states and "off" states based on the signal on the bypass control line 312. In other embodiments, there may be multiple bypass control lines, wherein each of the bypass control lines can be coupled to one or more of the first transistor 306, the second transistor 308, and the third transistor 310. In these embodiments, each of the bypass control lines can control the state of the transistors to which it is coupled.

The first transistor 306 may be coupled between the transmitter output line 220 and the test circuitry output line 228. When the first transistor 306 is in an "on" state, the first transistor 306 may couple the transmitter output line 220 to the test circuitry output line 228, thereby providing a low impedance path between the transmitter output line 220 and the test circuitry output line 228 through the first transistor 306 and allowing current to flow through the first transistor 306. When the first transistor 306 is in an "off" state, the first transistor 306 may decouple the transmitter output line 220 from the test circuitry output line 228, thereby creating a high impedance path between the transmitter output line 220 and the test circuitry output line 228 through the first transistor 306 and preventing current flow through the first transistor 306.

The second transistor 308 may be coupled between the transmitter output line 220 and a switching circuitry input line 314. When the second transistor 308 is in an "on" state, the second transistor 308 may couple the transmitter output line 220 and the switching circuitry input line 314, thereby providing a low impedance path between the transmitter output line 220 and the switching circuitry input line 314 through the second transistor 308 and allowing current to flow through the second transistor 308. When the second transistor 308 is in an "off" state, the second transistor 308 may decouple the transmitter output line 220 from the switching circuitry input line 314, thereby creating a high impedance path between the transmitter output line 220 and the switching circuitry input line 314 through the second transistor 308 and preventing current flow through the second transistor 308.

The third transistor 310 may be coupled between a switching circuitry output line 316 and the test circuitry output line 228. When the third transistor 310 is in an "on" state, the third transistor 310 may couple the switching circuitry output line 316 and the test circuitry output line 228, thereby providing a low impedance path between the switching circuitry output line 316 and the test circuitry output line 228 through the third transistor 310 and allowing current to flow through the third transistor 310. When the third transistor 310 is in an "off" state, the third transistor 310 may decouple the switching circuitry output line 316 from the test circuitry output line 228 through the third transistor 310 and prevent current flow through the third transistor 310.

In the first state of the bypass circuitry 302, a signal may be applied to the bypass control line 312 that causes the first transistor 306 to be in an "off" state, and the second transistor 308 and the third transistor 310 to be in an "on" state. Accordingly, the first transistor 306 may decouple the transmitter output line 220 and the test circuitry output line 228 via the path through the first transistor 306. Further, the second transistor 308 may couple the transmitter output line 220 and the switching circuitry input line 314 via the path through the second transistor 308, and the third transistor 310 may couple the switching circuitry output line 316 and the test circuitry output line 228 via the path through the third transistor 310. Therefore, the switching circuitry 304 may be coupled between the transmitter 210 and the channel 208 based on the states of the first transistor 306, the second transistor 308, and the third transistor 310. The first state of the bypass circuitry 302 may be associated with a test state of the first die 204.

In the second state of the bypass circuitry, a signal may be applied to the bypass control line 312 that causes the first transistor 306 to be in an "on" state, and the second transistor 308 and the third transistor 310 to be in an "off" state. Accordingly, the first transistor 306 may couple the transmitter output line 220 and the test circuitry output line 228 via the path through the first transistor 306. Further, the second transistor 308 may decouple the transmitter output line 220 and the switching circuitry input line 314 via the path through the second transistor 308, and the third transistor 310 may decouple the switching circuitry output line 316 and the test circuitry output line 228 via the path through the third transistor 310. Therefore, the transmitter 210 may be coupled with the channel 208 and the switching circuitry 304 may be decoupled from the transmitter 210 and the channel 208 based on the states of the first transistor 306, the second transistor 308, and the third transistor 310. The second state of the bypass circuitry 302 may be associated with a normal operation state of the first die 204.

The switching circuitry 304 may include a first transistor 318, a second transistor 320, and current control circuitry 322. The switching circuitry 304 may couple the voltage rail 218 or the ground 224 to the channel 208 during a test state of the first die 204. In particular, the switching circuitry input line 314 may be coupled to the first transistor 318 and the second transistor 320. A signal applied to the switching circuitry input line 314 may control states of the first transistor 318 and the second transistor 320. Depending on the states of the first transistor 318 and the second transistor 320, the channel 208 may be coupled to the voltage rail 218 or the ground 224.

The first transistor 318 may be coupled between the voltage rail 218 and the switching circuitry output line 316. When the first transistor 318 is in an "on" state, the first transistor 318 may couple the voltage rail 218 and the switching circuitry output line 316, thereby providing a low impedance path between the voltage rail 218 and the switching circuitry output line 316 and allowing current to flow through the first transistor 318. When the first die 204 is in a test state, the third transistor 310 of the bypass circuitry 302 may couple the switching circuitry output line 316 and the channel 208, thereby coupling the voltage rail 218 to the channel 208. When the first transistor 318 is in an "off" state, the first transistor 318 may decouple the voltage rail 218 from the switching circuitry output line 316, thereby creating a high impedance path between the voltage rail 218 and the switching circuitry output line 316 and preventing current flow through the first transistor 318.

The second transistor 320 may be coupled between ground 224 and the switching circuitry output line 316. The current control circuitry 322 may be coupled between the second transistor 320 and ground 224. When the second transistor 320 is in an "on" state, the second transistor 320 may couple the ground 224 and the switching circuitry output line 316, thereby providing a low impedance path between the ground 224 and the switching circuitry output line 316 and allowing current to flow through the second transistor 320. The current control circuitry 322 may limit an amount of current flow between ground 224 and the switching circuitry output line 316. In some embodiments, the current control circuitry 322 may be adjustable, allowing for the amount of current flow between ground 224 and the switching circuitry output line 316. When the first die 204 is in a test state, the third transistor 310 of the bypass circuitry 302 may couple the switching circuitry output line 316 and the channel 208, thereby coupling ground 224 to the channel 208. When the second transistor 320 is in an "off" state, the second transistor 320 may decouple ground 224 from the switching circuitry output line 316, thereby creating a high impedance path between ground 224 and the switching circuitry output line 316 and preventing current flow through the second transistor 320.

A signal applied to the switching circuitry input line 314 while the first die 204 is in the test state may control transitions of the first transistor 318 and the second transistor 320 between "on" and "off" states. The first transistor 318 and the second transistor 320 may have opposite doping. For example, if the first transistor 318 is a P-channel field-effect transistor, the second transistor 320 may be an N-channel field-effect transistor. Based on the first transistor 318 and the second transistor 320 having opposite doping, only one of the first transistor 318 and the second transistor 320 may be in an "on" state at a time, while the other of the first transistor 318 and the second transistor 320 is in an "off" state.

As the first transistor 318 and the second transistor 320 transition between "on" and "off" states while the first die 204 is in the test state, the channel 208 may transition between being coupled to the voltage rail 218 and ground 224. The channel 208 may charge to the voltage of the voltage rail 218 and discharge toward ground 224 as the coupling of the channel 208 between the voltage rail 218 and ground 224 is transitioned. The receiver 230 may compare the voltage of the channel 208 and the reference voltage 236. The receiver 230 may output a result of the comparison on the receiver output line 238, wherein the result may indicate the voltage of the channel 208. The receiver 230 may update the output on the receiver output line 238 based on a clock signal provided to the receiver 230 on the clock line 240. In some embodiments, the clock line 240 may be omitted and the output of the receiver 230 may track the result of the comparison.

Figure 4:
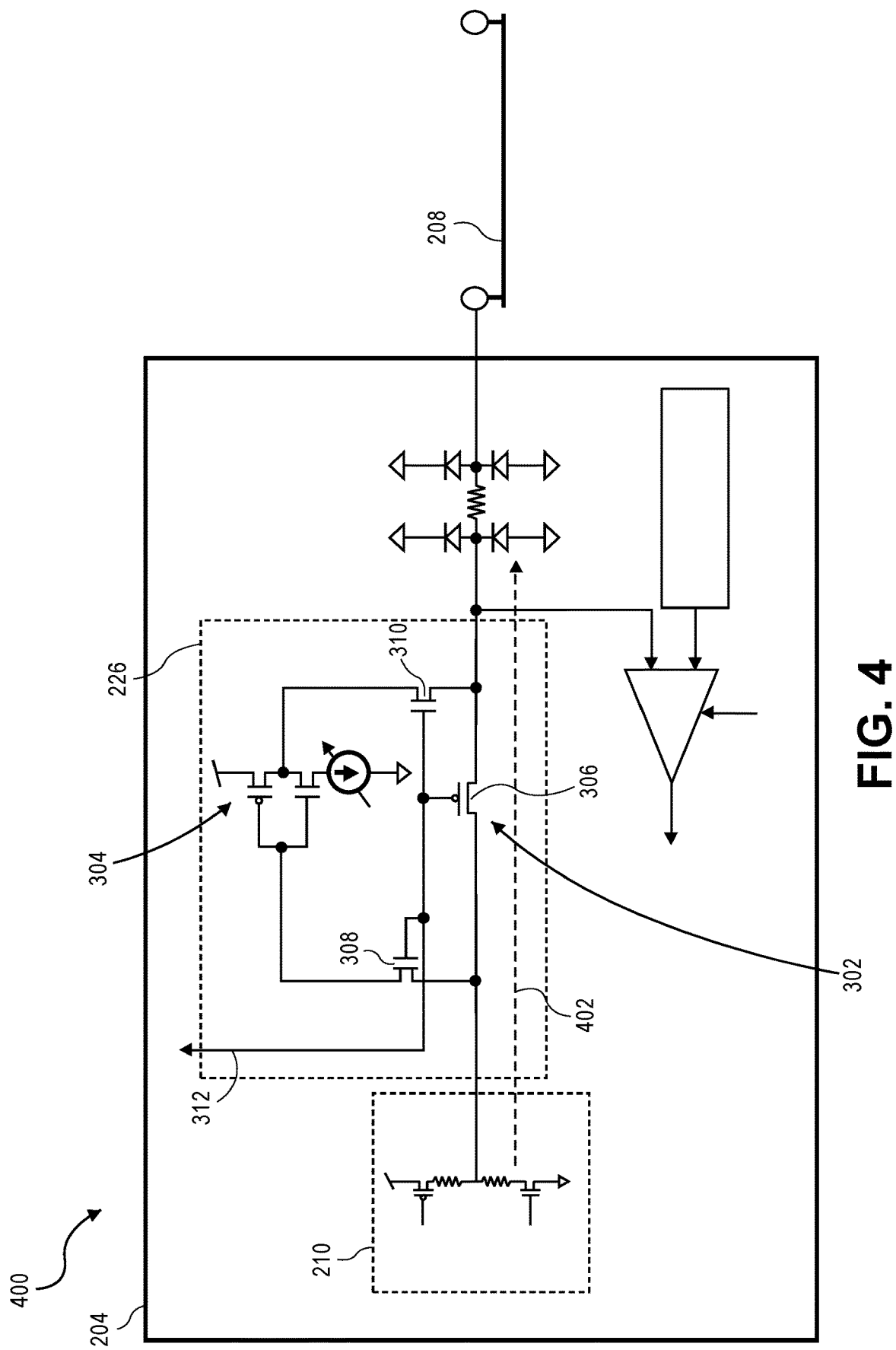
FIG. 4 illustrates an example circuit diagram of the portion of the IC package illustrated in FIG. 3 with the test circuitry in a bypass state, according to various embodiments.

FIG. 4 illustrates an example circuit diagram 400 of the portion of the IC package 202 illustrated in FIG. 3 with the test circuitry 226 in a bypass state, according to various embodiments. In particular, the bypass circuitry 302 may be in a bypass state, wherein the bypass circuitry 302 couples the transmitter 210 to the channel 208. The bypass state may correspond to a normal operation state of the first die 204.

A signal may be applied to the bypass control line 312 that causes the bypass circuitry 302 to be placed in the bypass state. The signal may cause the first transistor 306 of the bypass circuitry 302 to be in an "on" state, and the second transistor 308 and the third transistor 310 to be in "off" states. The first transistor 306 being in the "on" state may allow signals produced by the transmitter 210 to flow through the first transistor 306 to the channel 208 (as indicated by arrow 402), thereby bypassing the switching circuitry 304. The second transistor 308 and the third transistor 310 being in the "off" states may decouple the switching circuitry 304 from the transmitter 210 and the channel 208, thereby preventing the switching circuitry 304 from affecting the signal produced by the transmitter 210.

Figure 5:
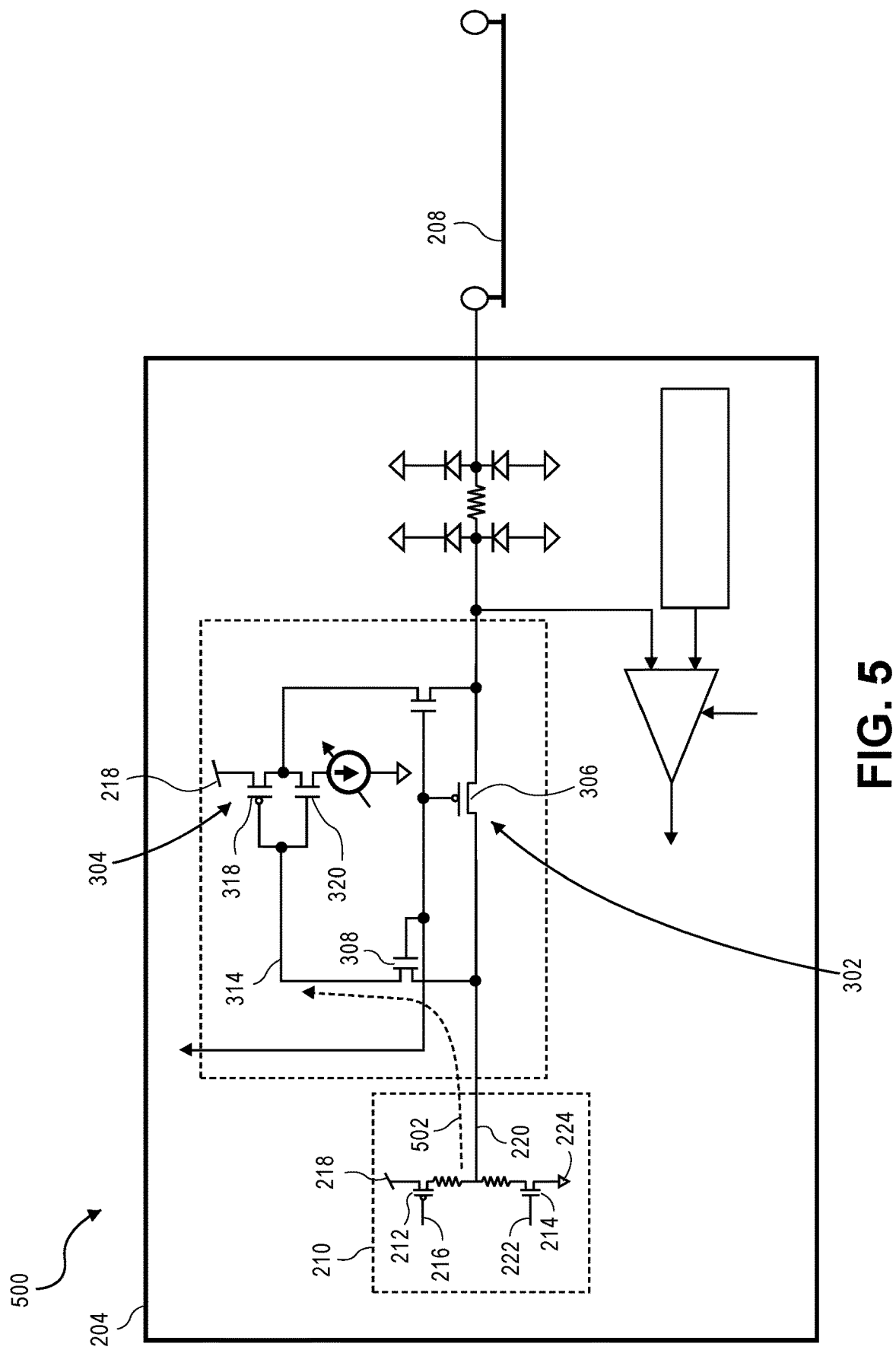
FIG. 5 illustrates an example circuit diagram of the portion of the IC package illustrated in FIG. 3 with the first die in a test state, according to various embodiments.

FIG. 5 illustrates an example circuit diagram 500 of the portion of the IC package 202 illustrated in FIG. 3 with the first die 204 in a test state, according to various embodiments. In particular, the circuit diagram 500 illustrates application of a test pattern to the switching circuitry 304.

When the first die 204 is in the test state, the bypass circuitry 302 may be in a non-bypass state. In particular, the first transistor 306 of the bypass circuitry 302 may be in an "off" state and the second transistor 308 of the bypass circuitry 302 may be in an "on" state. The first transistor 306 being in the "off" state may decouple the transmitter 210 from the channel 208 via the first transistor 306, thereby preventing signals from flowing through the first transistor 306. The second transistor 308 being in the "on" state may couple the transmitter 210 to the switching circuitry 304, thereby allowing signals applied to the transmitter output line 220 by the transmitter 210 to flow through the second transistor 308 to the switching circuitry input line 314.

Figure 11:
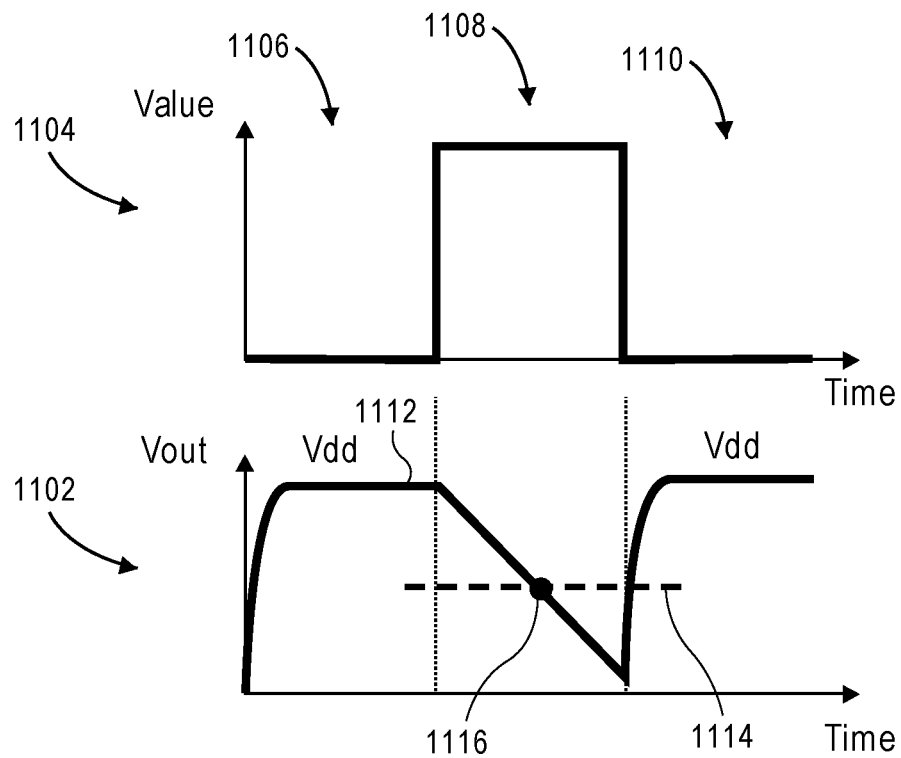
FIG. 11 illustrates an example voltage versus time representation produced by test circuitry, according to various embodiments.

The transmitter 210 may output a test pattern (as illustrated in FIG. 11 and/or FIG. 12) on the transmitter output line 220. The test pattern may be generated based on signals applied to the first control line 216 and the second control line 222. In particular, a signal on the first control line 216 may control the state of the first transistor 212 of the transmitter 210 and a signal on the second control line 222 may control the state of the second transistor 214 of the transmitter 210. Based on the signals on the first control line 216 and the second control line 222, the first transistor 212 and the second transistor 214 may transition between coupling the transmitter output line 220 to the voltage rail 218 of the first die 204 and coupling the transmitter output line 220 to ground 224 of the first die 204. The test pattern may be generated based on the transitioning of the coupling between the voltage rail 218 and ground 224.

The test pattern may flow through the second transistor 308 of the bypass circuitry 302 to the switching circuitry 304 (as indicated by arrow 502). The test pattern may cause the first transistor 318 and the second transistor 320 to transition between states, as is described further in FIG. 6 and FIG. 7.

Figure 6:
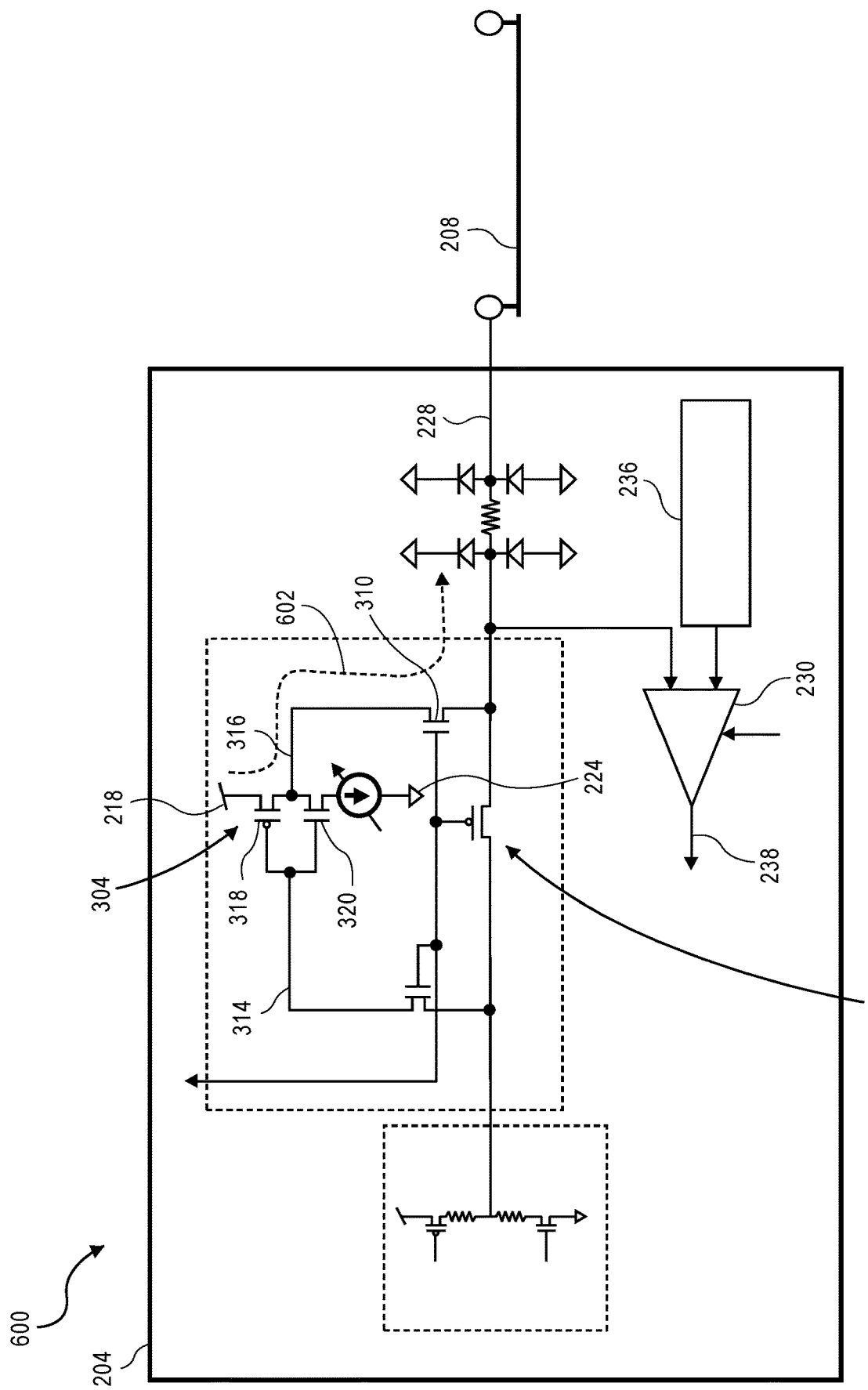
FIG. 6 illustrates an example circuit diagram of the portion of the IC package illustrated in FIG. 3 with the switching circuitry in a first switch state, according to various embodiments.

FIG. 6 illustrates an example circuit diagram 600 of the portion of the IC package 202 illustrated in FIG. 3 with the switching circuitry 304 in a first switch state, according to various embodiments. The first die 204 may be in a test state when the switching circuitry 304 is in the first switch state. Further, the bypass circuitry 302 may be in the non-bypass state.

When the switching circuitry 304 is in the first switch state, the first transistor 318 may be in the "on" state and the second transistor 320 may be in the "off" state based on a current value of the test pattern on the switching circuitry input line 314. The first transistor 318 may couple the switching circuitry output line 316 to the voltage rail 218 when the first transistor 318 is in the "on" state. Further, the second transistor 320 may decouple the switching circuitry output line 316 from ground 224 when the second transistor 320 is in the "off" state.

When the bypass circuitry 302 is in the non-bypass state, the third transistor 310 may be in the "on" state. The third transistor 310 may couple the switching circuitry output line 316 to the test circuitry output line 228 when the third transistor 310 is in the "on" state. Further, the test circuitry output line 228 may be coupled to the channel 208. Accordingly, the first transistor 318 of the switching circuitry 304 and the third transistor 310 of the bypass circuitry 302 may couple the voltage rail 218 to the channel 208 when the switching circuitry 304 is in the first switch state, thereby allowing the flow of current between the voltage rail 218 and the channel 208 (as indicated by arrow 602). The channel 208 may charge toward the voltage of the voltage rail 218, or may be charged at the voltage of the voltage rail 218, based on the channel 208 being coupled to the voltage rail 218.

The receiver 230 may sense the voltage of the channel 208 (sensed at the test circuitry output line 228 that is coupled to the channel 208 in the illustrated embodiment) while the channel 208 is being charged, and/or is fully charged, based on the channel 208 being coupled to the voltage rail 218. The receiver 230 may compare the voltage of the channel 208 with the reference voltage 236 to determine the voltage of the channel 208. The receiver 230 may output an indication of the voltage of the channel 208 based on the results of the comparison.

Figure 7:
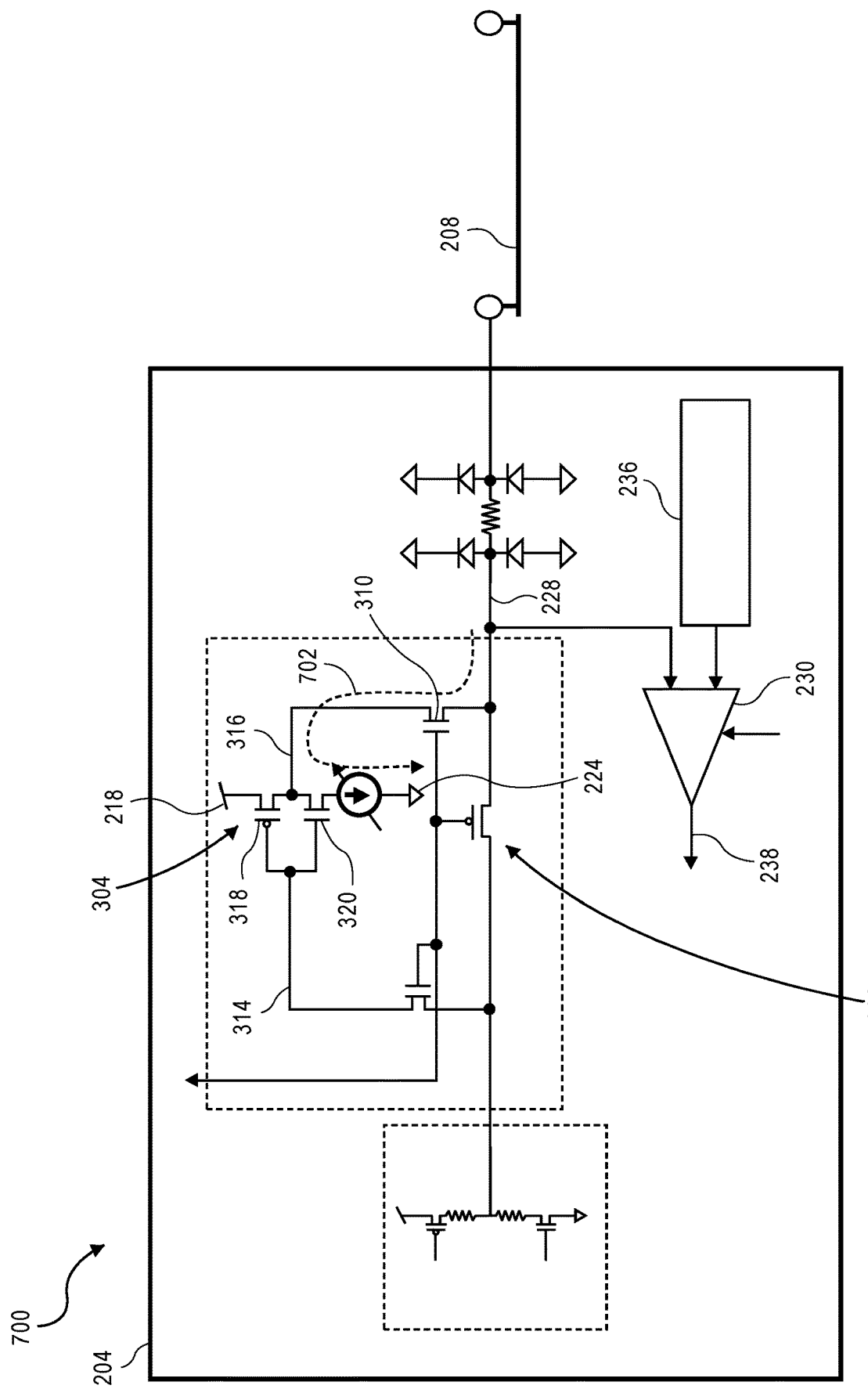
FIG. 7 illustrates an example circuit diagram of the portion of the IC package illustrated in FIG. 3 with the switching circuitry in a second switch state, according to various embodiments.

FIG. 7 illustrates an example circuit diagram 700 of the portion of the IC package 202 illustrated in FIG. 3 with the switching circuitry 304 in a second switch state, according to various embodiments. The first die 204 may be in a test state when the switching circuitry 304 is in the second switch state. Further, the bypass circuitry 302 may be in the non-bypass state.

When the switching circuitry 304 is in the second switch state, the first transistor 318 may be in the "off" state and the second transistor 320 may be in the "on" state based on a current value of the test pattern on the switching circuitry input line 314. The first transistor 318 may decouple the switching circuitry output line 316 from the voltage rail 218 when the first transistor 318 is in the "off" state. Further, the second transistor 320 may couple the switching circuitry output line 316 from ground 224 when the second transistor 320 is in the "on" state.

When the bypass circuitry 302 is in the non-bypass state, the third transistor 310 may be in the "on" state. The third transistor 310 may couple the switching circuitry output line 316 to the test circuitry output line 228 when the third transistor 310 is in the "on" state. Further, the test circuitry output line 228 may be coupled to the channel 208. Accordingly, the second transistor 320 of the switching circuitry 304 and the third transistor 310 of the bypass circuitry 302 may couple ground 224 to the channel 208 when the switching circuitry 304 is in the second switch state, thereby allowing the flow of current between ground 224 and the channel 208 (as indicated by arrow 702). The channel 208 may discharge toward ground 224, or may be discharged to ground 224, based on the channel 208 being coupled to ground 224.

The receiver 230 may sense the voltage of the channel 208 (sensed at the test circuitry output line 228 that is coupled to the channel 208 in the illustrated embodiment) while the channel 208 is being discharged, and/or is fully discharged, based on the channel 208 being coupled to ground 224. The receiver 230 may compare the voltage of the channel 208 with the reference voltage 236 to determine the voltage of the channel 208. The receiver 230 may output an indication of the voltage of the channel 208 based on the results of the comparison.

Figure 8:
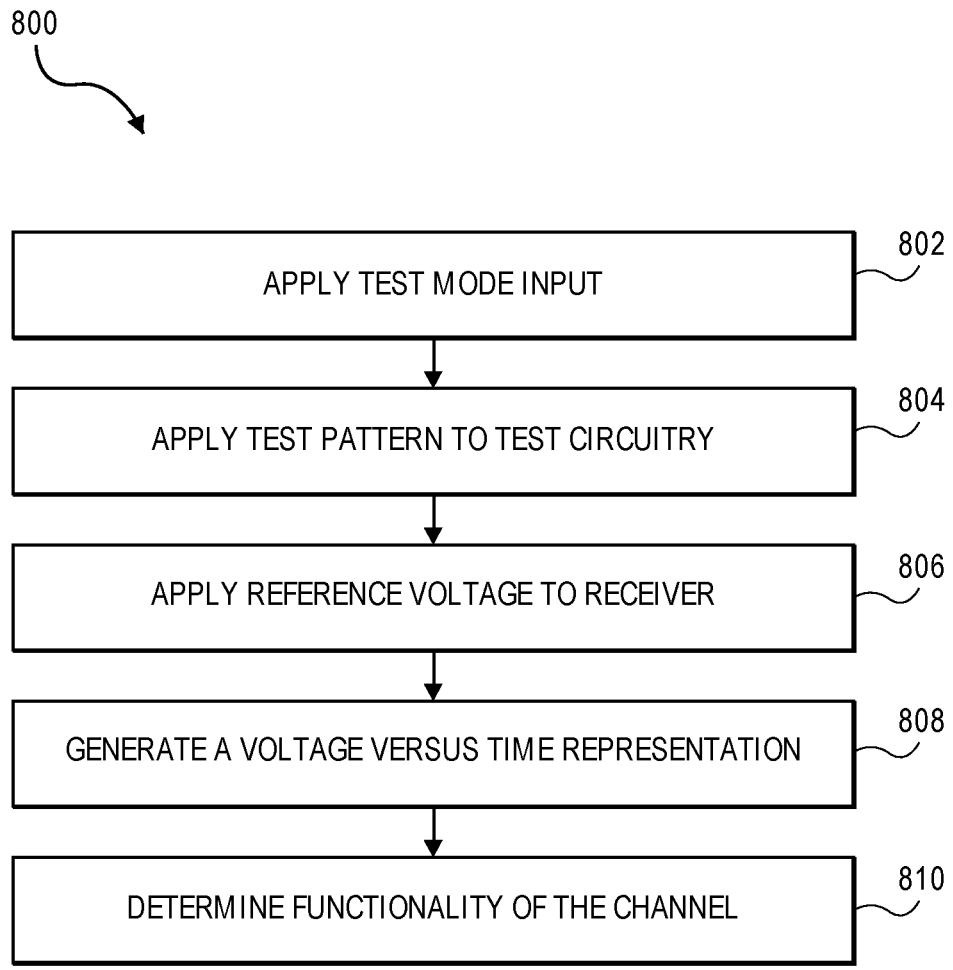
FIG. 8 illustrates an example procedure for determining channel functionality, according to various embodiments.

FIG. 8 illustrates an example procedure 800 for determining channel functionality, according to various embodiments. In particular, the procedure 800 may be utilized for determining the channel functionality of a channel (such as the first channel 112 (FIG. 1) and/or the channel 208 (FIG. 2)) of an IC package (such as the IC package 104 (FIG. 1) and/or the IC package 202 (FIG. 2)). The procedure 800 may utilize the test circuitry (such as the test circuitry 226 (FIG. 2)) to test the channel and determine the channel functionality of the channel. The procedure 800 may be performed by a computer device (such as the computer device 1300 (FIG. 13)) coupled to the IC package that applies signals to and receives signals from the IC package.

At stage 802, a test mode input may be applied to the test circuitry. The test mode input may include a signal applied to a bypass control line (such as the bypass control line 312 (FIG. 3)) of the test circuitry. The test mode input may cause the test circuitry to couple switching circuitry (such as the switching circuitry 304 (FIG. 3)) of the test circuitry between a transmitter (such as the transmitter 210 (FIG. 2)) of the IC package and the channel. In particular, the signal may be applied to bypass circuitry (such as the bypass circuitry 302 (FIG. 3)) of the test circuitry and may cause the bypass circuitry to couple the switching circuitry between the transmitter and the channel, as described herein.

At stage 804, a test pattern (such as the test pattern illustrated in FIG. 11 and/or FIG. 12) may be applied to the test circuitry. The test pattern may be generated by the transmitter of the IC package. In particular, signals corresponding to the test pattern may be applied to control lines (such as the first control line 216 (FIG. 2) and/or the second control line 222 (FIG. 2)) that cause the transmitter to output the test pattern. Applying the test pattern to the test circuitry may include applying a first signal value to the test circuitry during certain periods of time and applying a second signal value to the test circuitry during other periods of time. Applying the test pattern to the test circuitry may cause a first transistor (such as the first transistor 318 (FIG. 3)) to couple the channel to a voltage rail (such as the voltage rail 218 (FIG. 2)) during certain periods of time, and may cause a second transistor (such as the second transistor 320 (FIG.

3)) to couple the channel to ground (such as ground 224 (FIG. 2)) at other periods of time.

At stage 806, a reference voltage may be applied to a receiver (such as the receiver 230 (FIG. 2)) of the IC package. The reference voltage may be applied to the receiver while the test pattern is being applied to the test circuitry. The reference voltage may be stepped through a range of voltages over time. For example, the reference voltage may be set at a voltage equal to the voltage of the voltage rail. The reference voltage may be stepped down by a certain voltage at set periods of time until the reference voltage reaches ground. After the reference voltage reaches ground, the reference voltage may cycle back to the voltage of the voltage rail before being stepped down again. In other embodiments, the range of voltages may be less than or more than the range from the voltage of the voltage rail to ground. Further, in some other embodiments, the reference voltage may be set at certain values at specified times rather than being stepped through the values.

At stage 808, a voltage versus time representation may be generated. The voltage versus time representation may show a voltage of the channel versus time. For example, an indication of the voltage of the channel at a certain period of time may be output by the receiver of the IC package. The indication of the voltage of the channel may be generated by the receiver based on a comparison of a detected voltage on the channel with the reference voltage. In some embodiments, the indication of the voltage may be a logical high value to indicate that the detected voltage on the channel is greater than the reference voltage, or may be a logical low value to indicate that the detected voltage on the channel is less than the reference voltage. Based on the reference voltage being applied at the time and the indication of the voltage, the voltage of the channel may be determined.

Voltages of the channel may be determined at multiple times. Voltage-time pairs may be stored that include a determined voltage of the channel and the time the voltage was determined to be on the channel. A voltage versus time representation may be generated based on the voltage-time pairs, wherein the voltage versus time representation may indicate each of the determined voltages and the times when the determined voltages were on the channel. In some embodiments, the voltage versus time representation may include a graphical representation, such as a line graph, a scatter plot, and/or a shmoo plot, which may be displayed by the computer device. In other embodiments, the voltage versus time representation may be a collection of data that may indicate each of the determined times and the times when the determined voltages were on the channel.

At stage 810, a functionality of the channel may be determined. The functionality of the channel may be determined based on the voltage versus time representation. For example, the channel may be expected to charge at a certain rate and/or discharge at a certain rate based on the test pattern being applied to the test circuitry. The expected rate of charging may be compared to portions of the voltage versus time representation that indicate the channel is charging, and/or the expected rate of discharging may be compared to portions of the voltage versus time representation that indicate that the channel is discharging to determine the functionality of the channel. For example, if the channel charges at approximately (within 5% of the expected rate) the expected rate of charging and discharges at approximately (within 5% of the expected rate) the expected rate of discharging, the channel may be determined to be operating properly. If the channel charges at a higher rate than the expected rate of charge, the channel may be determined to be open or to have a higher resistance than intended. If the channel charges at a lower rate than the expected rate of charge, the channel may be determined to be shorted or is leaking current.

In some embodiments, a channel capacitance of the channel may be determined based on the voltage versus time representation. For example, the channel capacitance may be determined based on the rate of discharge of the channel. The channel capacitance may be calculated by the rate of current flowing to ground during discharge divided by the result of the voltage of the voltage rail minus the determined voltage divided by the change in time. For example, the channel capacitance C may be calculated by $$C = \frac{I_{sink}}{(V_{dd} - V_{out})/\Delta t},$$

wherein $I_{sink}$ is the rate of current flowing to ground during discharge, $V_{dd}$ is the voltage of the voltage rail, $V_{out}$ is a determined voltage of the channel, and $\Delta t$ is the change in time. The functionality of the channel may be determined based on the calculated channel capacitance.

In some embodiments, the calculated channel capacitance may be utilized to determine a location of defect in the functionality of the channel. In particular, the calculated channel capacitance may be utilized to determine whether the defect occurs in a transmitting die in which the test circuitry resides, in a receiving die to which the transmitting die is coupled via the channel, and/or at a location along the channel. Determination of the location of the defect is described further in relation to FIG. 9.

Figure 9:
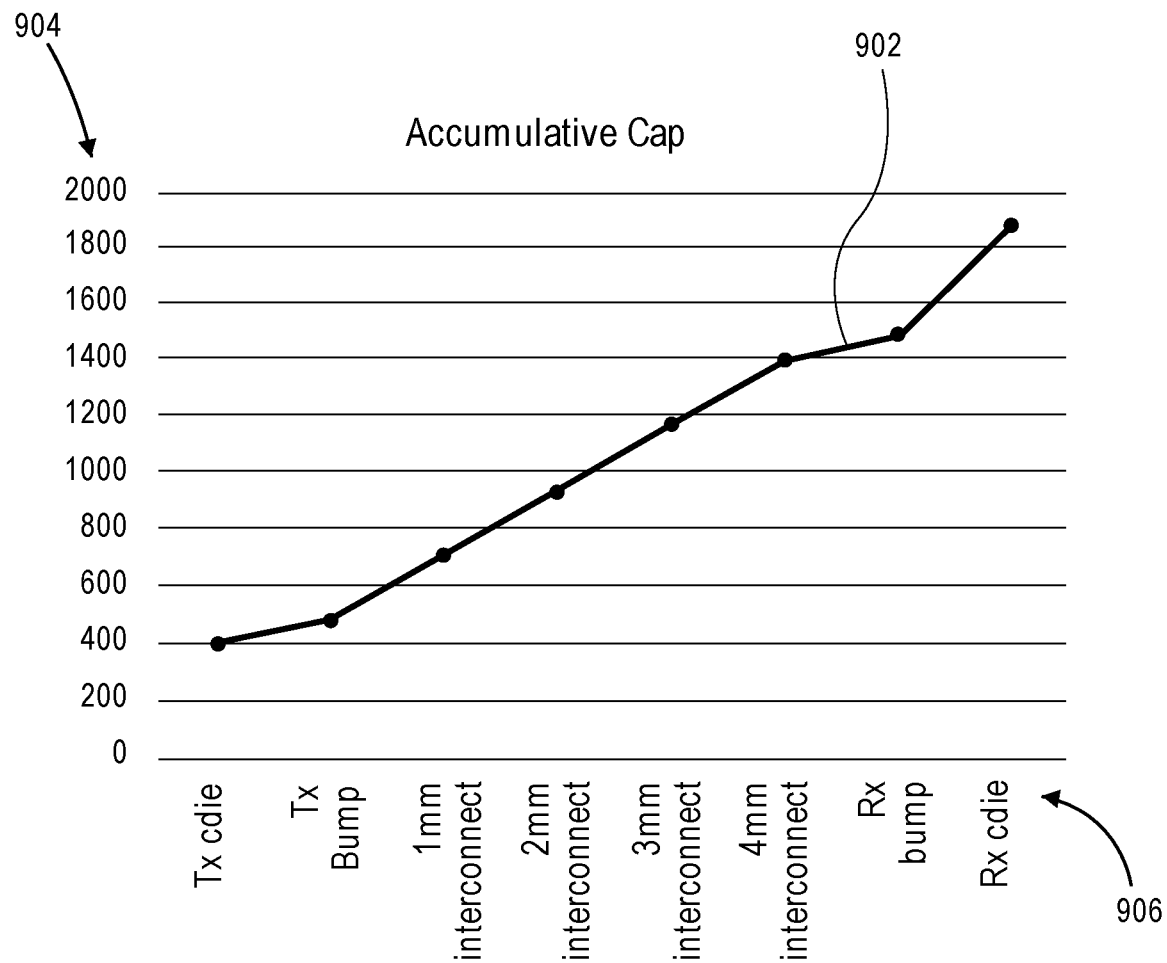
FIG. 9 illustrates an example capacitance-location graph, according to various embodiments.

FIG. 9 illustrates an example capacitance-location graph 900, according to various embodiments. The capacitance-location graph 900 illustrates an example capacitance-location curve 902 that may be utilized for determining a location of a defect in the functionality of a channel (such as the channel 208 (FIG. 2)). The capacitance-location curve 902 may be utilized for determining a location of a discontinuity (which may corresponds to a determination of an open channel functionality). In other embodiments, capacitance-location curves may be utilized for determining locations of other defects, such as shorts and/or leakage points.

The capacitance-location graph 900 may have capacitance 904 shown on a y-axis and location 906 shown on an x-axis. The capacitance 904 may correspond to the calculated channel capacitance described in relation to FIG. 8. The location 906 may correspond to a location of the discontinuity. In particular, determining a location of the calculated channel capacitance on the capacitance-location curve 902 may provide a location of the discontinuity As can be seen, low calculated channel capacitances may be determined to have a discontinuity close to a transmitting die in which test circuitry (such as the test circuitry 226 (FIG. 2)), while higher calculated channel capacitances may be determined to have a discontinuity further away from the transmitting die. For example, a calculated channel capacitance of approximately 400 applied to the capacitance-location curve 902 may indicate that the discontinuity is within the transmitting die. Whereas, a calculated channel capacitance of approximately 1200 applied to the capacitance-location curve 902 may indicate that the discontinuity is located in the channel and three millimeters from the transmitting die.

Figure 10:
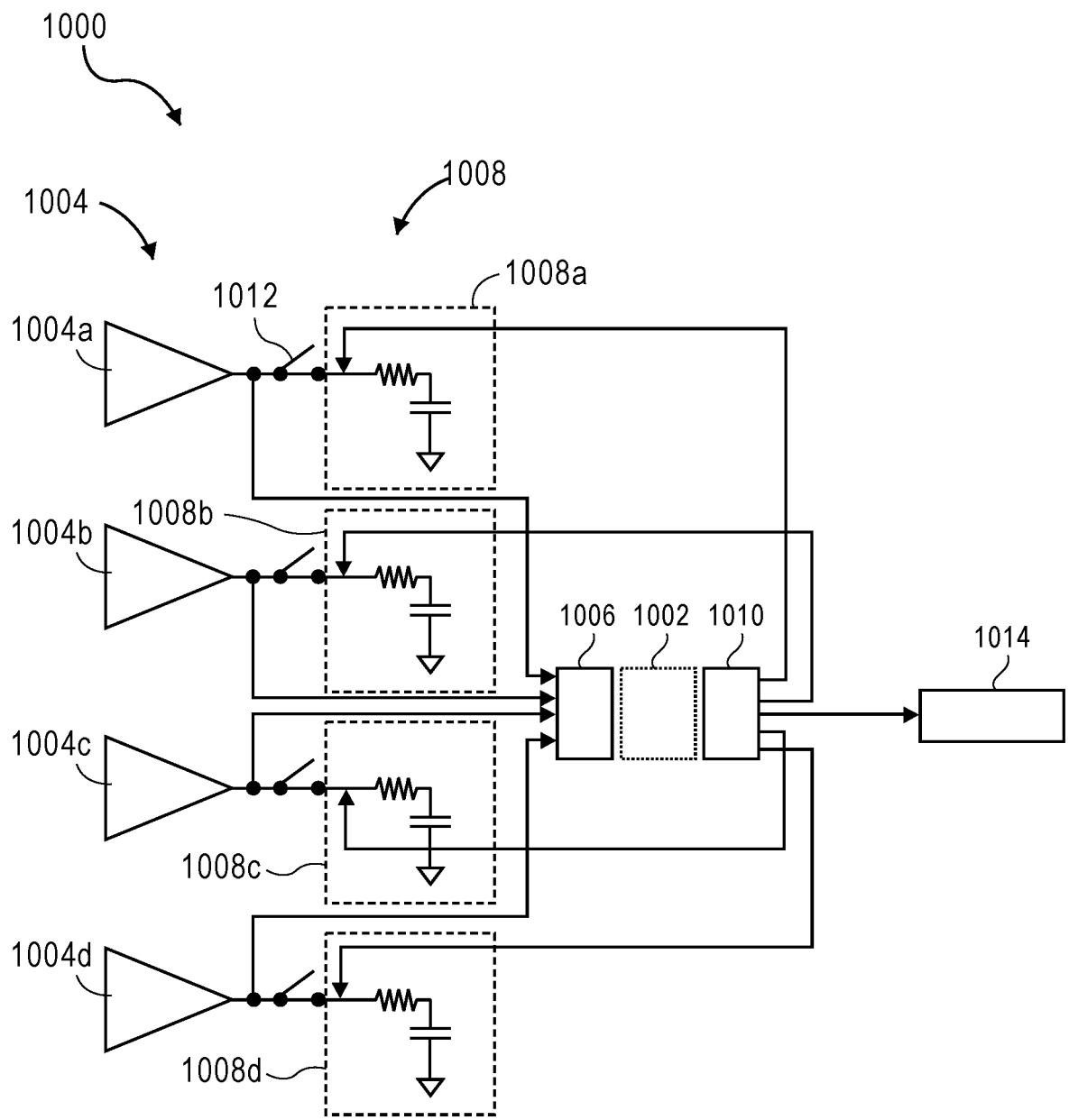
FIG. 10 illustrates example multiplexed test circuitry, according to various embodiments.

FIG. 10 illustrates example multiplexed test circuitry 1000, according to various embodiments. In particular, the multiplexed test circuitry 1000 may include single test circuitry 1002, which may be coupled to a plurality of transmitters 1004 and/or a plurality of channels 1008. For example, a first multiplexer 1006 may couple an input of the test circuitry 1002 to one of the transmitters 1004 and a second multiplexer 1010 may couple an output of the test circuitry 1002 to one of the channels 1008 that corresponds to the one of the transmitters 1004. The test circuitry 1002 may include one or more of the features of the test circuitry 226 (FIG. 2). Additionally, in some embodiments, the test circuitry 1002 may include a receiver (such as the receiver 230 (FIG. 2)), which may perform one or more of the operations of the receiver 230.

In the illustrated embodiment, multiplexed test circuitry 1000 includes a first transmitter 1004a, a second transmitter 1004b, a third transmitter 1004c, and a fourth transmitter 1004d, and corresponding first channel 1008a, second channel 1008b, third channel 1008c, and fourth channel 1008d, respectively. For brevity, description of only the first transmitter 1004a and the corresponding first channel 1008a is provided. It is to be understood that the other transmitters and the other channels may include one or more of the features of the first transmitter 1004a and the corresponding first channel 1008a, and may operate in the same fashion.

The first transmitter 1004a and the first channel 1008a may have a switch 1012 coupled between the first transmitter 1004a and the first channel 1008a. The switch 1012 may be implemented via circuitry that includes one or more transistors, such as the bypass circuitry 302. In a normal operation state of the first transmitter 1004a, the switch 1012 may couple the first transmitter 1004a to the first channel 1008a, thereby allowing current to flow through the switch 1012. Further, the first multiplexer 1006 and/or the second multiplexer 1010 may decouple the test circuitry 1002 from the first transmitter 1004a and/or the first channel 1008a when the first transmitter 1004a is in the normal operation state.

When the first transmitter 1004a is in a test state, the switch 1012 may decouple the first transmitter 1004a and the first channel 1008a via the switch 1012, thereby preventing current from flowing through the switch 1012. Further, the first multiplexer 1006 may couple the first transmitter 1004a to the test circuitry 1002 and the second multiplexer 1010 may couple the test circuitry 1002 to the channel 1008a. The second multiplexer 1010 may further couple the first channel 1008a to a view pin 1014 of the IC package. The test circuitry 1002 may perform one or more of the operations performed by test circuitry (such as the test circuitry 226) described in relation to FIG. 2 through FIG. 8. The test circuitry 1002 may further output determined voltages of the first channel 1008a on the view pin 1014, which may be utilized to generate a voltage versus time representation.

FIG. 11 illustrates an example voltage versus time representation 1102 produced by test circuitry, according to various embodiments. In particular, the voltage versus time representation 1102 may be produced by the test circuitry 226 (FIG. 2) and/or the test circuitry 1002 (FIG. 10). The voltage versus time representation 1102 may be produced in response to a test pattern (represented by test pattern graph 1104) being applied to an input of switching circuitry (such as the switching circuitry 304 (FIG. 3)) of the test circuitry.

The illustrated voltage versus time representation 1102 and the test pattern may be divided into three time periods of operation, the first time period 1106, the second time period 1108, and the third time period 1110. The first time period 1106 and the third time period 1110 may correspond to charging periods of the channel under test, and the second time period 1108 may correspond to a discharging period of the channel under test.

During the first time period 1106, the test pattern may be a logical low value. In particular, a logical low value may be applied to an input of the test circuitry, which may cause the test circuitry to couple the channel under test to a voltage rail of the IC package that includes the channel. The channel under test may charge to a voltage of the voltage rail (indicated by Vdd) when coupled to the voltage rail.

During the second time period 1108, the test pattern may be a logical high value. In particular, a logical high value may be applied to an input of the test circuitry, which may cause the test circuitry to couple the channel under test to ground of the IC package. Further, a current control circuitry (such as the current control circuitry 322 (FIG. 3)) may be coupled between the channel and ground when the logical high value is applied to the input of the test circuitry. The channel under test may discharge toward ground when coupled to ground.

During the third time period 1110, the test pattern may be a logical low value. In particular, a logical low value may be applied to an input of the test circuitry, which may cause the test circuitry to couple the channel under test to a voltage rail of the IC package that includes the channel. The channel under test may charge to a voltage of the voltage rail (indicated by Vdd) when coupled to the voltage rail.

The voltage of the channel (indicated by line 1112) may increase to the voltage of the voltage rail during charging of the channel. During discharge in the second time period 1108, a determined value (indicated by dotted line 1114) of the voltage of the channel and corresponding time (indicated by dot 1116) at which the determined value was captured may be determined. The determined value may be compared to an expected voltage of the channel at the time to determine the functionality of the channel. In other embodiments, the determined value and corresponding time, the rate of discharge of the channel, and/or the rate of charge of the channel may be utilized to determine the functionality of the channel.

Figure 12:
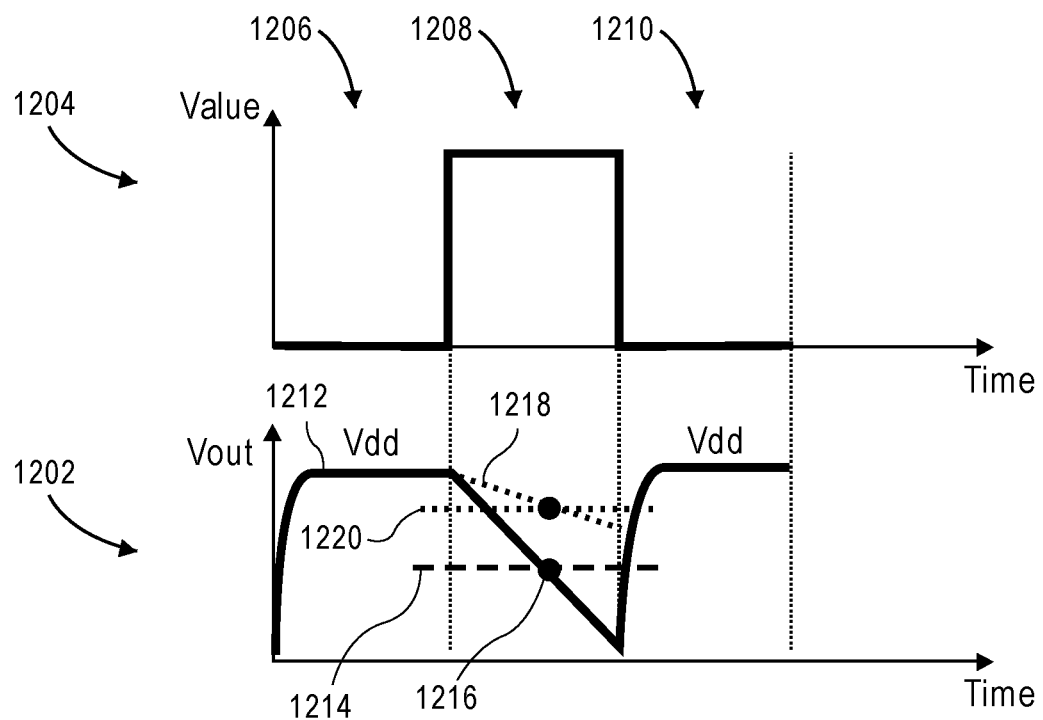
FIG. 12 illustrates another example voltage versus time representation produced by test circuitry, according to various embodiments.

FIG. 12 illustrates another example voltage versus time representation 1202 produced by test circuitry, according to various embodiments. In particular, the voltage versus time representation 1202 may be produced by the test circuitry 226 (FIG. 2) and/or the test circuitry 1002 (FIG. 10). The voltage versus time representation 1202 may be produced in response to a test pattern (represented by test pattern graph 1204) being applied to an input of switching circuitry (such as the switching circuitry 304 (FIG. 3)) of the test circuitry.

The illustrated voltage versus time representation 1202 and the test pattern may be divided into three time periods of operation, the first time period 1206, the second time period 1208, and the third time period 1210. The first time period 1206 and the third time period 1210 may correspond to charging periods of the channel under test, and the second time period 1208 may correspond to a discharging period of the channel under test.

During the first time period 1206, the test pattern may be a logical low value. In particular, a logical low value may be applied to an input of the test circuitry, which may cause the test circuitry to couple the channel under test to a voltage rail of the IC package that includes the channel. The channel under test may charge to a voltage of the voltage rail (indicated by Vdd) when coupled to the voltage rail.

During the second time period 1208, the test pattern may be a logical high value. In particular, a logical high value may be applied to an input of the test circuitry, which may cause the test circuitry to couple the channel under test to ground of the IC package. Further, a current control circuitry (such as the current control circuitry 322 (FIG. 3)) may be coupled between the channel and ground when the logical high value is applied to the input of the test circuitry. The channel under test may discharge toward ground when coupled to ground.

During the third time period 1210, the test pattern may be a logical low value. In particular, a logical low value may be applied to an input of the test circuitry, which may cause the test circuitry to couple the channel under test to a voltage rail of the IC package that includes the channel. The channel under test may charge to a voltage of the voltage rail (indicated by Vdd) when coupled to the voltage rail.

The voltage of the channel (indicated by line 1212) may increase to the voltage of the voltage rail during charging of the channel. During discharge in the second time period 1208, a determined value (indicated by dotted line 1214) of the voltage of the channel and corresponding time (indicated by dot 1216) at which the determined value was captured may be determined. The determined value may be compared to an expected voltage of the channel at the time to determine the functionality of the channel. In other embodiments, the determined value and corresponding time, the rate of discharge of the channel, and/or the rate of charge of the channel may be utilized to determine the functionality of the channel.

In the illustrated embodiment, the expected rate of change (indicated by dotted line 1218) may be less than the rate of change of the channel. Further, the expected voltage (indicated by dotted line 1220) at the time may be higher than the determined voltage. In this embodiment, the channel may be determined to be operating improperly.

Figure 13:
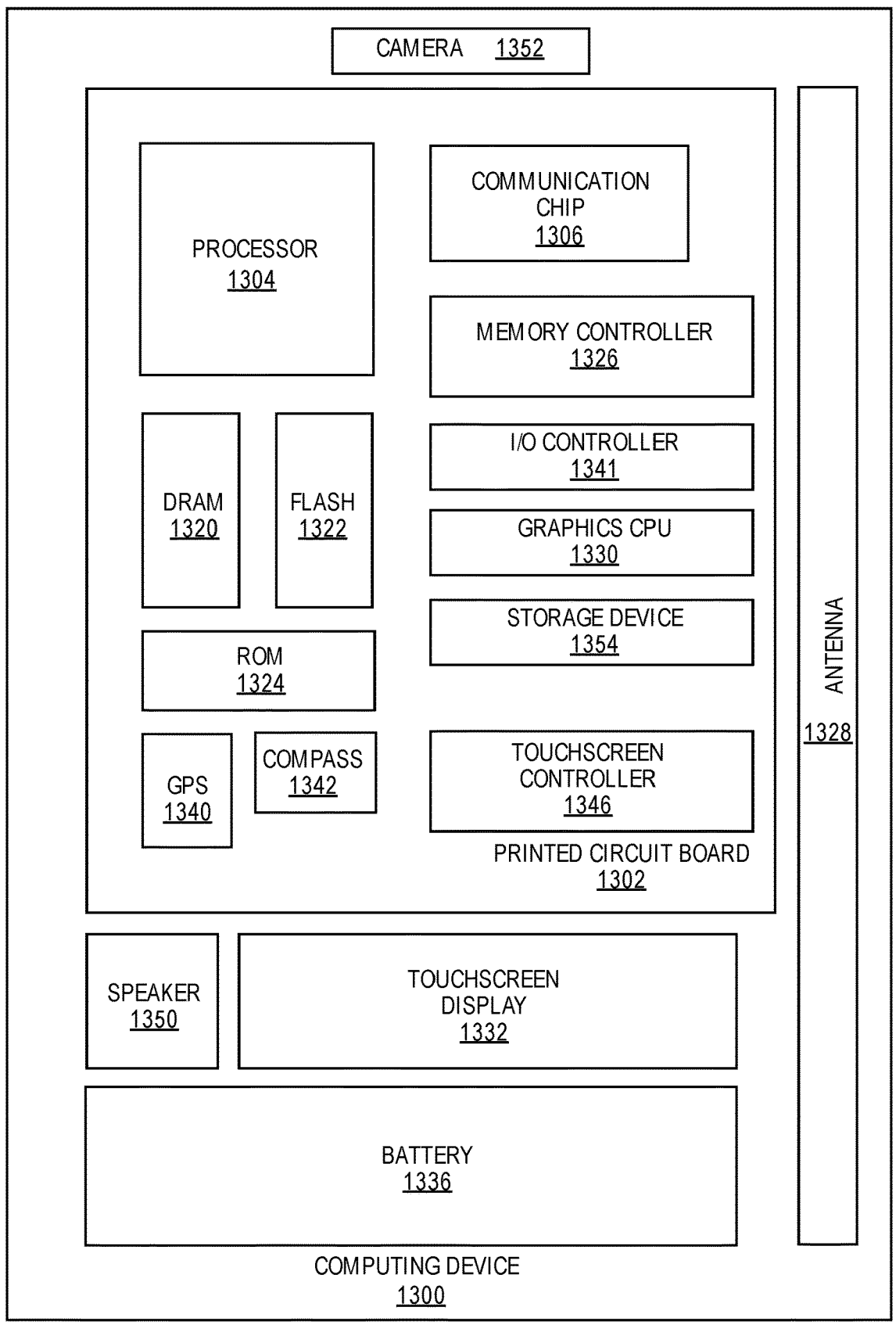
FIG. 13 illustrates an example computer device that may employ the apparatuses and/or methods described herein, in accordance with various embodiments.

FIG. 13 illustrates an example computer device 1300 that may employ the apparatuses and/or methods described herein (e.g., the IC package 104, the IC package 202, the procedure 800, and/or the multiplexed test circuitry 1000), in accordance with various embodiments. For example, the computer device 1300 may perform the procedure 800 (FIG. 8), and/or one or more of the components (including, but not limited to, the processor 1304, the communication chip 1306, the memory controller 1326, the input/output (I/O) controller 1341, the graphics CPU 1330, and/or the touch screen controller 1346) may implement the IC package 104 (FIG. 1), the IC package 202 (FIG. 2), and/or the multiplexed test circuitry 1000 (FIG. 10). As shown, computer device 1300 may include a number of components, such as one or more processor(s) 1304 (one shown) and at least one communication chip 1306. In various embodiments, the one or more processor(s) 1304 each may include one or more processor cores. In various embodiments, the at least one communication chip 1306 may be physically and electrically coupled to the one or more processor(s) 1304. In further implementations, the communication chip 1306 may be part of the one or more processor(s) 1304. In various embodiments, computer device 1300 may include printed circuit board (PCB) 1302. For these embodiments, the one or more processor(s) 1304 and communication chip 1306 may be disposed thereon. In alternate embodiments, the various components may be coupled without the employment of PCB 1302.

Depending on its applications, computer device 1300 may include other components that may or may not be physically and electrically coupled to the PCB 1302. These other components include, but are not limited to, memory controller 1326, volatile memory (e.g., dynamic random access memory (DRAM) 1320), non-volatile memory such as read only memory (ROM) 1324, flash memory 1322, storage device 1354 (e.g., a hard-disk drive (HDD)), an I/O controller 1341, a digital signal processor (not shown), a crypto processor (not shown), a graphics processor 1330, one or more antenna 1328, a display (not shown), a touch screen display 1332, a touch screen controller 1346, a battery 1336, an audio codec (not shown), a video codec (not shown), a global positioning system (GPS) device 1340, a compass 1342, an accelerometer (not shown), a gyroscope (not shown), a speaker 1350, a camera 1352, and a mass storage device (such as hard disk drive, a solid state drive, compact disk (CD), digital versatile disk (DVD)) (not shown), and so forth.

In some embodiments, the one or more processor(s) 1304, flash memory 1322, and/or storage device 1354 may include associated firmware (not shown) storing programming instructions configured to enable computer device 1300, in response to execution of the programming instructions by one or more processor(s) 1304, to practice all or selected aspects of the methods described herein. In various embodiments, these aspects may additionally or alternatively be implemented using hardware separate from the one or more processor(s) 1304, flash memory 1322, or storage device 1354.

The communication chips 1306 may enable wired and/or wireless communications for the transfer of data to and from the computer device 1300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1306 may implement any of a number of wireless standards or protocols, including but not limited to IEEE 802.20, Long Term Evolution (LTE), LTE Advanced (LTE-A), General Packet Radio Service (GPRS), Evolution Data Optimized (Ev-DO), Evolved High Speed Packet Access (HSPA+), Evolved High Speed Downlink Packet Access (HSDPA+), Evolved High Speed Uplink Packet Access (HSUPA+), Global System for Mobile Communications (GSM), Enhanced Data rates for GSM Evolution (EDGE), Code Division Multiple Access (CDMA), Time Division Multiple Access (TDMA), Digital Enhanced Cordless Telecommunications (DECT), Worldwide Interoperability for Microwave Access (WiMAX), Bluetooth, derivatives thereof, as well as any other wireless protocols that are designated as 3G, 4G, 5G, and beyond. The computer device 1300 may include a plurality of communication chips 1306. For instance, a first communication chip 1306 may be dedicated to shorter range wireless communications such as Wi-Fi and Bluetooth, and a second communication chip 1306 may be dedicated to longer range wireless communications such as GPS, EDGE, GPRS, CDMA, WiMAX, LTE, Ev-DO, and others.

In various implementations, the computer device 1300 may be a laptop, a netbook, a notebook, an ultrabook, a smartphone, a computer tablet, a personal digital assistant (PDA), an ultra-mobile PC, a mobile phone, a desktop computer, a server, a printer, a scanner, a monitor, a set-top box, an entertainment control unit (e.g., a gaming console or automotive entertainment unit), a digital camera, an appliance, a portable music player, or a digital video recorder. In further implementations, the computer device 1300 may be any other electronic device that processes data.

Example 1 may include an integrated circuit (IC) package, comprising a first die, a second die, and a channel that couples the first die to the second die, wherein the first die includes a transmitter, test circuitry coupled between the transmitter and the channel, wherein the test circuitry is to control charge and discharge of the channel, and a receiver coupled to the channel, wherein the receiver is to determine a voltage of the channel during charge and discharge of the channel, and output an indication of the voltage.

Example 2 may include the IC package of example 1, wherein the test circuitry includes switching circuitry to couple the channel to a voltage rail of the IC package to charge the channel when the switching circuitry is in a first switch state and to a ground of the IC package to discharge the channel when the switching circuitry is in a second switch state.

Example 3 may include the IC package of example 2, wherein the test circuitry further includes current control circuitry coupled between the switching circuitry and the ground, wherein the current control circuitry is to control a rate of current flow from the channel to the ground when the switching circuitry is in the second switch state.

Example 4 may include the IC package of example 2, wherein the switching circuitry includes a first transistor coupled between the voltage rail and the channel, the first transistor to couple the channel to the voltage rail when the switching circuitry is in the first switch state and decouple the channel from the voltage rail when the switching circuitry is in the second switch state, and a second transistor coupled between the ground and the channel, the second transistor to couple the channel to the ground when the switching circuitry is in the second switch state and decouple the channel from the ground when the switching circuitry is in the first switch state.

Example 5 may include the IC package of example 2, wherein the transmitter is to output a test pattern that causes the switching circuitry to transition between the first switch state and the second switch state.

Example 6 may include the IC package of example 2, wherein the test circuitry further includes bypass circuitry, wherein the bypass circuitry is to couple the transmitter to the channel and decouple the switching circuitry from the transmitter and the channel when the bypass circuitry is in a first state, and wherein the bypass circuitry is to couple the switching circuitry between the transmitter and the channel when the bypass circuitry is in a second state.

Example 7 may include the IC package of example 6, wherein the bypass circuitry includes a first transistor coupled between the transmitter and the channel, wherein the first transistor is to couple the transmitter to the channel when the bypass circuitry is in the first state and decouple the transmitter from the channel when the bypass circuitry is in the second state, a second transistor coupled between the transmitter and the switching circuitry, wherein the second transistor is to couple the transmitter to the switching circuitry when the bypass circuitry is in the second state and decouple the transmitter from the switching circuitry when the bypass circuitry is in the first state, and a third transistor coupled between the switching circuitry and the channel, wherein the third transistor is to couple the switching circuitry to the channel when the bypass circuitry is in the second state and decouple the switching circuitry from the channel when the bypass circuitry is in the first state.

Example 8 may include the IC package of any of examples 1-7, wherein the receiver is coupled to a voltage reference that is to step through a series of voltages, wherein the receiver determines the voltage of the channel based on a comparison between the voltage of the channel and the voltage reference, and wherein the indication of the voltage is based on a result of the comparison.

Example 9 may include the IC package of any of examples 1-7, wherein the channel comprises an internal input/output channel.

Example 10 may include a computer device, comprising a printed circuit board (PCB), and an integrated circuit (IC) package coupled to the PCB, the IC package comprising a first die, a second die, and a channel that couples the first die to the second die, wherein the first die includes a transmitter, test circuitry coupled between the transmitter and the channel, wherein the test circuitry is to control charge and discharge of the channel, and a receiver coupled to the channel, wherein the receiver is to determine a voltage of the channel during charge and discharge of the channel, and output an indication of the voltage.

Example 11 may include the computer device of example 10, wherein the test circuitry includes switching circuitry to couple the channel to a voltage rail of the IC package to charge the channel when the switching circuitry is in a first switch state and to a ground of the IC package to discharge the channel when the switching circuitry is in a second switch state.

Example 12 may include the computer device of example 11, wherein the test circuitry further includes current control circuitry coupled between the switching circuitry and the ground, wherein the current control circuitry is to control a rate of current flow from the channel to the ground when the switching circuitry is in the second switch state.

Example 13 may include the computer device of any of examples 11 or 12, wherein the switching circuitry includes a first transistor coupled between the voltage rail and the channel, the first transistor to couple the channel to the voltage rail when the switching circuitry is in the first switch state and decouple the channel from the voltage rail when the switching circuitry is in the second switch state, and a second transistor coupled between the ground and the channel, the second transistor to couple the channel to the ground when the switching circuitry is in the second switch state and decouple the channel from the ground when the switching circuitry is in the first switch state.

Example 14 may include the computer device of any of examples 11 or 12, wherein the transmitter is to output a test pattern that causes the switching circuitry to transition between the first switch state and the second switch state.

Example 15 may include the computer device of any of examples 11 or 12, wherein the test circuitry further includes bypass circuitry, wherein the bypass circuitry is to couple the transmitter to the channel and decouple the switching circuitry from the transmitter and the channel when the bypass circuitry is in a first state, and wherein the bypass circuitry is to couple the switching circuitry between the transmitter and the channel when the bypass circuitry is in a second state.

Example 16 may include the computer device of example 10, wherein the channel comprises an internal input/output channel.

Example 17 may include a method of testing a channel of an integrated circuit (IC) package, comprising applying, by a computer device, a test pattern to test circuitry of a die of the IC package, wherein the test circuitry is coupled to the channel and controls charging and discharging of the channel, generating, by the computer device, a voltage versus time representation for the channel based on a voltage of the channel produced by the test pattern being applied, and determining, by the computer device, functionality of the channel based on the voltage versus time representation.

Example 18 may include the method of example 17, wherein applying the test pattern includes applying a first signal value to the test circuitry during a first period of time, wherein the first signal value causes the test circuitry to charge the channel during the first period of time, wherein applying the test pattern further includes applying a second signal value to the test circuitry during a second period of time, and wherein the second signal value causes the test circuitry to discharge the channel during the second period of time.

Example 19 may include the method of example 18, wherein applying the test pattern includes applying, by the computer device, signals corresponding to the test pattern to a transmitter of the die, wherein the transmitter causes the first signal value to be applied to the test circuitry during the first period of time and the second signal value to be applied to the test circuitry during the second period of time based on the signals applied to the transmitter.

Example 20 may include the method of any of examples 17-19, wherein applying the test pattern to the test circuitry causes a first transistor of the test circuitry to couple the channel to a voltage rail of the IC package during a first period of time and a second transistor of the test circuitry to couple the channel to a ground of the IC package during a second period of time.

Example 21 may include the method of any of examples 17-19, further comprising applying, by the computer device, a reference voltage to a receiver of the die, wherein the reference voltage is stepped through a voltage range, and wherein the receiver indicates the voltage of the channel based on a comparison of the voltage of the channel with the reference voltage that is performed by the receiver.

Example 22 may include the method of any of examples 17-19, wherein determining the functionality of the channel includes determining that the channel is open, the channel is shorted, the channel has high resistance, the channel is leaking, or the channel is operating properly based on the voltage versus time representation.

Example 23 may include the method of any of examples 17-19, further comprising applying, by the computer device, a test mode input to the test circuitry, wherein the test mode input causes the test circuitry to couple switching circuitry of the test circuitry between a transmitter of the die and the channel, and wherein the transmitter applies the test pattern to the switching circuitry to cause the switching circuitry to charge and discharge the channel.

Example 24 may include the method of any of examples 17-19, wherein the voltage versus time representation comprises a shmoo plot.

Example 25 may include the method of any of examples 17-19, wherein the channel comprises an internal input/output channel of the IC package.

Example 26 may include an apparatus to perform the method of any of examples 17-25.

Example 27 may include an apparatus comprising means for performing the method of any of examples 17-25.

Example 28 may include a computer-readable medium to perform the method of any of examples 17-25.

It will be apparent to those skilled in the art that various modifications and variations can be made in the disclosed embodiments of the disclosed device and associated methods without departing from the spirit or scope of the disclosure. Thus, it is intended that the present disclosure covers the modifications and variations of the embodiments disclosed above provided that the modifications and variations come within the scope of any claims and their equivalents.

What is claimed is:

1. An integrated circuit (IC) package, comprising: a first die; a second die; and a channel that couples the first die to the second die, wherein the first die includes: a transmitter; test circuitry coupled between the transmitter and the channel, wherein the test circuitry is to control charge and discharge of the channel; and a receiver coupled to the channel, wherein the receiver is to: receive a voltage of the channel during charge and discharge of the channel; and output an indication of the voltage, wherein the receiver is coupled to a voltage reference that is to step through a series of voltages, wherein the receiver outputs the voltage of the channel based on a comparison between the voltage of the channel and the voltage reference, and wherein the indication of the voltage is based on a result of the comparison to determine the functionality of the channel.

2. The IC package of claim 1, wherein the test circuitry includes switching circuitry to couple the channel to a voltage rail of the IC package to charge the channel when the switching circuitry is in a first switch state and to a ground of the IC package to discharge the channel when the switching circuitry is in a second switch state.

3. The IC package of claim 2, wherein the test circuitry further includes current control circuitry coupled between the switching circuitry and the ground, wherein the current control circuitry is to control a rate of current flow from the channel to the ground when the switching circuitry is in the second switch state.

4. The IC package of claim 2, wherein the switching circuitry includes: a first transistor coupled between the voltage rail and the channel, the first transistor to couple the channel to the voltage rail when the switching circuitry is in the first switch state and decouple the channel from the voltage rail when the switching circuitry is in the second switch state; and a second transistor coupled between the ground and the channel, the second transistor to couple the channel to the ground when the switching circuitry is in the second switch state and decouple the channel from the ground when the switching circuitry is in the first switch state.

5. The IC package of claim 2, wherein the transmitter is to output a test pattern that causes the switching circuitry to transition between the first switch state and the second switch state.

6. The IC package of claim 2, wherein the test circuitry further includes bypass circuitry, wherein the bypass circuitry is to couple the transmitter to the channel and decouple the switching circuitry from the transmitter and the channel when the bypass circuitry is in a first state, and wherein the bypass circuitry is to couple the switching circuitry between the transmitter and the channel when the bypass circuitry is in a second state.

7. The IC package of claim 6, wherein the bypass circuitry includes: a first transistor coupled between the transmitter and the channel, wherein the first transistor is to couple the transmitter to the channel when the bypass circuitry is in the first state and decouple the transmitter from the channel when the bypass circuitry is in the second state; a second transistor coupled between the transmitter and the switching circuitry, wherein the second transistor is to couple the transmitter to the switching circuitry when the bypass circuitry is in the second state and decouple the transmitter from the switching circuitry when the bypass circuitry is in the first state; and a third transistor coupled between the switching circuitry and the channel, wherein the third transistor is to couple the switching circuitry to the channel when the bypass circuitry is in the second state and decouple the switching circuitry from the channel when the bypass circuitry is in the first state.

8. The IC package of claim 1, wherein the channel comprises an internal input/output channel.

9. A computer device, comprising: a printed circuit board (PCB); and an integrated circuit (IC) package coupled to the PCB, the IC package comprising: a first die; a second die; and a channel that couples the first die to the second die, wherein the first die includes: a transmitter; test circuitry coupled between the transmitter and the channel, wherein the test circuitry is to control charge and discharge of the channel; and a receiver coupled to the channel, wherein the receiver is to: determine a voltage of the channel during charge and discharge of the channel; and output an indication of the voltage, wherein the test circuitry includes switching circuitry to couple the channel to a voltage rail of the IC package to charge the channel when the switching circuitry is in a first switch state and to a ground of the IC package to discharge the channel when the switching circuitry is in a second switch state, wherein the test circuitry further includes bypass circuitry, wherein the bypass circuitry is to couple the transmitter to the channel and decouple the switching circuitry from the transmitter and the channel when the bypass circuitry is in a first state, and wherein the bypass circuitry is to couple the switching circuitry between the transmitter and the channel when the bypass circuitry is in a second state.

10. The computer device of claim 9, wherein the test circuitry further includes current control circuitry coupled between the switching circuitry and the ground, wherein the current control circuitry is to control a rate of current flow from the channel to the ground when the switching circuitry is in the second switch state.

11. The computer device of claim 9, wherein the switching circuitry includes: a first transistor coupled between the voltage rail and the channel, the first transistor to couple the channel to the voltage rail when the switching circuitry is in the first switch state and decouple the channel from the voltage rail when the switching circuitry is in the second switch state; and a second transistor coupled between the ground and the channel, the second transistor to couple the channel to the ground when the switching circuitry is in the second switch state and decouple the channel from the ground when the switching circuitry is in the first switch state.

12. The computer device of claim 9, wherein the transmitter is to output a test pattern that causes the switching circuitry to transition between the first switch state and the second switch state.

13. The computer device of claim 9, wherein the channel comprises an internal input/output channel.

14. An integrated circuit (IC) package, comprising: a first die; a second die; and a channel that couples the first die to the second die, wherein the first die includes: a transmitter; test circuitry coupled between the transmitter and the channel, wherein the test circuitry is to control charge and discharge of the channel; and a receiver coupled to the channel, wherein the receiver is to: determine a voltage of the channel during charge and discharge of the channel; and output an indication of the voltage, wherein the test circuitry includes switching circuitry to couple the channel to a voltage rail of the IC package to charge the channel when the switching circuitry is in a first switch state and to a ground of the IC package to discharge the channel when the switching circuitry is in a second switch state, wherein the test circuitry further includes bypass circuitry, wherein the bypass circuitry is to couple the transmitter to the channel and decouple the switching circuitry from the transmitter and the channel when the bypass circuitry is in a first state, and wherein the bypass circuitry is to couple the switching circuitry between the transmitter and the channel when the bypass circuitry is in a second state.

15. The IC package of claim 14, wherein the bypass circuitry includes: a first transistor coupled between the transmitter and the channel, wherein the first transistor is to couple the transmitter to the channel when the bypass circuitry is in the first state and decouple the transmitter from the channel when the bypass circuitry is in the second state; a second transistor coupled between the transmitter and the switching circuitry, wherein the second transistor is to couple the transmitter to the switching circuitry when the bypass circuitry is in the second state and decouple the transmitter from the switching circuitry when the bypass circuitry is in the first state; and a third transistor coupled between the switching circuitry and the channel, wherein the third transistor is to couple the switching circuitry to the channel when the bypass circuitry is in the second state and decouple the switching circuitry from the channel when the bypass circuitry is in the first state.

* * * * *